(12) United States Patent
Tanaka

(10) Patent No.: US 8,796,055 B2
(45) Date of Patent: Aug. 5, 2014

(54) METHOD FOR MANUFACTURING GROUP III NITRIDE SEMICONDUCTOR LIGHT-EMITTING ELEMENT, GROUP III NITRIDE SEMICONDUCTOR LIGHT-EMITTING ELEMENT, LAMP, AND RETICLE

(71) Applicant: Toyoda Gosei Co., Ltd., Kiyosu (JP)

(72) Inventor: Kazufumi Tanaka, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/773,208

(22) Filed: Feb. 21, 2013

(65) Prior Publication Data

US 2013/0221388 A1  Aug. 29, 2013

(30) Foreign Application Priority Data

Feb. 24, 2012 (JP) ................................ 2012-038612

(51) Int. Cl.
| | |
|---|---|
| *H01L 21/18* | (2006.01) |
| *H01L 21/033* | (2006.01) |
| *H01L 33/00* | (2010.01) |
| *G03F 1/00* | (2012.01) |

(52) U.S. Cl.
CPC ........ *H01L 21/0334* (2013.01); *H01L 33/0075* (2013.01); *G03F 1/00* (2013.01); *Y10S 438/943* (2013.01)
USPC ......... 438/29; 257/98; 257/E21.023; 438/943

(58) Field of Classification Search
CPC .... H01L 21/0334; H01L 33/0075; G03F 1/00
USPC ............... 257/98, E21.023; 438/29, 942, 943
See application file for complete search history.

(56) References Cited

U.S. PATENT DOCUMENTS

| | | | | |
|---|---|---|---|---|
| 7,357,837 | B2 * | 4/2008 | Motoki et al. ................. | 117/84 |
| 7,804,101 | B2 * | 9/2010 | Niki et al. ..................... | 257/98 |
| 2005/0001227 | A1 * | 1/2005 | Niki et al. ..................... | 257/98 |
| 2008/0303042 | A1 * | 12/2008 | Minato et al. ................. | 257/98 |
| 2009/0267098 | A1 * | 10/2009 | Choi .............................. | 257/98 |
| 2010/0096657 | A1 * | 4/2010 | Ou et al. ........................ | 257/98 |

(Continued)

FOREIGN PATENT DOCUMENTS

| | | |
|---|---|---|
| JP | 2836687 B | 12/1998 |
| JP | 2002-280611 A | 9/2002 |

(Continued)

*Primary Examiner* — Allan R Wilson
(74) *Attorney, Agent, or Firm* — Sughrue Mion, PLLC

(57) ABSTRACT

A method for manufacturing a Group III nitride semiconductor light-emitting element of the invention includes a substrate-processing process of forming a main surface including a flat surface and a convex portion 13 on the substrate 10, an epitaxial process of epitaxially growing an underlying layer on the main surface of the substrate 10 so as to cover the flat surface and the convex portion 13, and an LED lamination process of forming an LED structure by epitaxially growing a Group III nitride semiconductor. In the substrate-processing process, mask patterns 15 are sequentially formed in respective regions R1 and R2 of the flat surface using a polygonal reticle 51 having two pairs of parallel opposing ends in a plan view, by a stepper exposure method, and then the flat surface is etched to dispose and form three arbitrary convex portions 13, which are arranged to be adjacent to each other, in an isosceles triangular shape in a plan view.

14 Claims, 9 Drawing Sheets

(56) References Cited

U.S. PATENT DOCUMENTS

2010/0197055 A1* 8/2010 Tanaka et al. .................. 438/29
2011/0062479 A1* 3/2011 Sugano et al. .................. 257/98
2011/0198560 A1* 8/2011 Okagawa et al. .............. 257/13

FOREIGN PATENT DOCUMENTS

| JP | 2005-101566 A | 4/2005 |
| JP | 2005-129896 A | 5/2005 |
| JP | 2007-273659 A | 10/2007 |

* cited by examiner

METHOD FOR MANUFACTURING GROUP III NITRIDE SEMICONDUCTOR LIGHT-EMITTING ELEMENT, GROUP III NITRIDE SEMICONDUCTOR LIGHT-EMITTING ELEMENT, LAMP, AND RETICLE

BACKGROUND OF THE INVENTION

1. Field of the Invention

The present invention relates to a method for manufacturing a Group III nitride semiconductor light-emitting element having a light-emitting diode (LED) structure, a Group III nitride semiconductor light-emitting element, a lamp, and a reticle that is used for the manufacturing of the Group III nitride semiconductor light-emitting element.

Priority is claimed on Japanese Patent Application No. 2012-038612, filed on Feb. 24, 2012, the content of which is incorporated herein by reference.

2. Description of Related Art

In recent years, as a semiconductor material for a light-emitting element that emits light with a short wavelength, a Group III nitride semiconductor has attracted attention. The Group III nitride semiconductor is expressed by a general formula $Al_xGa_yIn_zN$ ($0 \leq x \leq 1$, $0 \leq y \leq 1$, $0 \leq z \leq 1$, and $x+y+z=1$), and is formed on a substrate formed from various oxides such as a sapphire single crystal or Group III-V compound by a metalorganic chemical vapor deposition (MOCVD) method, a molecular beam epitaxy (MBE) method, or the like.

In a general light-emitting element using the Group III nitride semiconductor, an n-type semiconductor layer formed from the Group III nitride semiconductor, a light-emitting layer, and a p-type semiconductor layer are laminated on a substrate formed from a sapphire single crystal in this order. The sapphire substrate is an insulating body, and thus, generally, an element structure has a structure in which a positive electrode formed on the p-type semiconductor layer and a negative electrode formed on the n-type semiconductor layer are present in the same plane. In this Group III nitride semiconductor light-emitting element, two kinds of element are present including a face-up type in which a transparent electrode is used for the positive electrode, and light is extracted from the p-type semiconductor side, and a flip-chip type in which a highly reflective film such as Ag is used for the positive electrode, and light is extracted from the sapphire substrate side.

As an output index of this light-emitting element, external quantum efficiency is used. When the external quantum efficiency is high, it can be said that the light-emitting element has a high output. The external quantum efficiency is a value obtained by multiplying internal quantum efficiency and light extraction efficiency. The internal quantum efficiency represents a conversion ratio of energy of a current, which is injected to the element, into light at the light-emitting layer. The light extraction efficiency represents a ratio of light, which may be extracted to the outside of the light-emitting element, in the light that is generated at the light-emitting layer. Accordingly, it is necessary to improve the light extraction efficiency so as to improve the external quantum efficiency.

As a method of improving the light extraction efficiency, two methods may be exemplified. One is a method of reducing light absorption due to an electrode or the like that is formed on a light extraction surface. The other is a method of reducing light confinement inside the light-emitting element, which occurs due to a difference in a refractive index between the light-emitting element and an external medium.

As a method of reducing the light confinement of the light at the inside of the light-emitting element, a technology in which concavity and convexity are formed in a light extraction surface of the light-emitting element may be exemplified (for example, refer to Japanese Patent No. 2836687).

However, in the light-emitting element in which the concavity and convexity are formed in the light extraction surface by mechanical processing or chemical processing, a load that is caused by the processing in the light extraction surface is given to the semiconductor layer, and thus damage is caused to the light-emitting layer. In addition, in the light-emitting element in which the semiconductor layer is grown under conditions in which the concavity and convexity are formed in the light extraction surface, the crystallinity of the semiconductor layer deteriorates, and thus the light-emitting layer contains defects. Therefore, in the case of forming the concavity and convexity in the light extraction surface, the light extraction efficiency is improved, but the internal quantum efficiency decreases. As a result, there is a problem in that it is difficult to increase light emission intensity.

Therefore, a method is suggested in which the concavity and convexity are formed in a surface of a substrate formed from sapphire instead of forming the concavity and convexity in the light extraction surface, and the Group III nitride semiconductor layer is grown on the concavity and convexity (for example, refer to Japanese Unexamined Patent Application, First Publication No. 2002-280611). Furthermore, a method is suggested in which a GaN crystal is made to grow on a substrate having a curved convex portion that is formed as a concavo-convex shape of the substrate (for example, refer to Japanese Unexamined Patent Application, First Publication No. 2005-129896). In addition, a method is also suggested in which a buffer layer is formed on a light-transmitting substrate having a concavo-convex shape according to a sputtering method using a sputtering device (for example, refer to Japanese Unexamined Patent Application, First Publication No. 2007-273659). In addition, a semiconductor light-emitting element is suggested in which as a concavo-convex arrangement pattern on a substrate, convex portions are periodically disposed in the plane of the substrate with approximately the same interval in each of two axial directions intersecting each other in a predetermined angle, and the semiconductor layer is formed on the substrate (for example, refer to Japanese Unexamined Patent Application, First Publication No. 2005-101566).

Particularly, according to each of the methods described in Japanese Unexamined Patent Application, First Publication Nos. 2002-280611, 2005-129896, 2007-273659, and 2005-101566, since the interface between the sapphire substrate and the Group III nitride semiconductor layer has a concavo-convex shape, the light confinement inside the light-emitting element may be reduced by scattered reflection of light on the interface due to a difference in a refractive index between the sapphire substrate and the Group III nitride semiconductor layer, and thus the light extraction efficiency may be improved. In addition, it is possible to reduce crystal defects by using the growth of the crystal in a lateral direction due to the concavity and convexity formed in the surface of the sapphire substrate, and it is possible to improve the internal quantum efficiency.

SUMMARY OF THE INVENTION

Similarly to the technologies described in Japanese Unexamined Patent Application, First Publication Nos. 2002-280611, 2005-129896, 2007-273659, and 2005-101566, in the case of forming the concavity and convexity in the surface of the substrate, a method is used in which mask patterns are formed on a substrate using any one of a stepper exposure (reduced projection type exposure) method, a nanoimprint method, an electron beam (EB) exposure method, and a laser exposure method, and the substrate is etched to form the concavity and convexity. At this time, as the concavity and convexity in the substrate surface, for example, in a case of forming a plurality of convex portions having a small diameter of approximately 0.05 to 1.5 µm, the stepper exposure method capable of forming relatively fine mask patterns is used.

Generally, in a case of forming the mask patterns in the substrate surface according to the stepper exposure method, first, a resist material is applied onto the substrate, and then mask patterns of a reticle (photomask) are reduced using a projection lens and are projected and exposed to the resist material on the substrate. At this time, the reticle, which is smaller than the substrate, is made to relatively move on the substrate that is formed from sapphire or the like and has a circular shape, or both of the substrate and the reticle are made to relatively move to sequentially form the resist material in respective regions of the substrate surface into desired mask patterns. In this stepper exposure method, since the mask patterns are reduced with the projection lens and are exposed to the resist, fine patterns may be formed.

In the case of forming the mask patterns by the stepper exposure method as described above, as shown in FIG. 12, a reticle 200 is made to move on a surface of a substrate 100, and mask patterns 110 are sequentially formed in respective regions 100A, 100B, and the like.

At this time, it is preferable for dots 220 to be disposed in a triangular disposition that is capable of performing the disposition with the highest density from the viewpoint of increasing the light extraction efficiency. However, in a case of disposing the dots 220 in the triangular disposition in each of the reticles 200 having a rectangular shape in a plan view, a distance between the edge 210 of the reticle 200 and the dots 220 decreases. As a result, it is necessary to exactly maintain spacing of a joint line 150 between the respective regions 100A and 100B, but in this case, there is a high possibility for portions not normally exposed to be formed between the respective regions 100A and 100B. At this time, a positive resist at a portion that is not normally exposed remains as a linear mask pattern, and then a linear convex portion is formed on the substrate 100 after etching. In addition, in the portion at which the linear convex portion is formed, growth of a Group III nitride semiconductor crystal does not normally occur, and a modified portion, in which density of crystal defect such as dislocation is high, is formed. Therefore, as shown in FIG. 12, when being converted into a chip as a light-emitting element, a step difference occurs in a surface of a semiconductor crystal of the modified portion. Therefore, there is a concern that the surface of the semiconductor crystal does not become a mirror surface, and deteriorates in an external appearance aspect. In addition, when an element is formed, light-emitting properties are adversely affected.

In addition, when the distance between the edge 210 of the reticle 200 and the dots 220 is small, there is a concern that the mask patterns 110 connect to the joint line 150 due to interference of light, and thus a shape of the dots may be deformed. In addition, when it is intended for the convex portion to be disposed in high density, the dots 220 are formed on the edge 210 of the reticle 200. In this case, even when the spacing of the joint line 150 between the respective regions 100A and 100B slightly deviates, deformation or deficiency of the dots occurs. In a case where the deformation or deficiency of the dots occurs, the light extraction efficiency decreases. In addition, due to the deficiency of the dots, the crystal defect of the Group III nitride semiconductor layer is not reduced, and the internal quantum efficiency decreases.

Due to the above-described reasons, when using the methods in the related art, there is a concern that when the deformation or deficiency of the dots occurs, this may have an effect on the light-emitting properties of the element.

The invention has been made in consideration of the above-described problems, and an object thereof is to provide a method for manufacturing a Group III nitride semiconductor light-emitting element which is capable of manufacturing the Group III nitride semiconductor light-emitting element having excellent internal quantum efficiency and light extraction efficiency with high productivity, and a Group III nitride semiconductor light-emitting element that may be obtained according to the method.

Furthermore, another object of the invention is to provide a lamp in which the Group III nitride semiconductor light-emitting element is used and which has excellent light-emitting properties.

Furthermore, still another object of the invention is to provide a reticle that is used for the manufacturing of the Group III nitride semiconductor light-emitting element.

The present inventors have made a thorough investigation to solve the above-described problems, and as a result, they have completed the invention. That is, the invention relates to the following configurations.

[1] A method for manufacturing a Group III nitride semiconductor light-emitting element in which a single crystalline Group III nitride semiconductor layer is formed on a substrate formed from sapphire, and an LED structure is formed on the Group III nitride semiconductor layer, the method including: a substrate-processing process of periodically forming a plurality of convex portions having a base width $d_1$ and a height h in a flat surface, which is formed from a (0001) C-plane, of the substrate to form a main surface including the flat surface and the convex portions in the substrate; an epitaxial process of epitaxially growing the Group III nitride semiconductor on the main surface of the substrate so as to cover the flat surface and the convex portions; and an LED lamination process of forming the LED structure by epitaxially growing the Group III nitride semiconductor subsequently to the epitaxial process, wherein the substrate-processing process includes a patterning process of sequentially forming mask patterns in respective regions of the flat surface using a polygonal reticle having two pairs of parallel opposing ends in a plan view by a stepper exposure method, and an etching process of forming the plurality of convex portions by etching the flat surface using the mask patterns, and wherein, in an in-plane direction of the flat surface of the substrate, the plurality of convex portions are arranged to be parallel with the two pairs of parallel ends of the reticle, respectively, and to be periodic in two axial directions of one arrangement axis and the other arrangement axis intersecting each other, and, among the plurality of convex portions, three arbitrary convex portions, which are adjacent to each other and are arranged in a triangular shape in a plan view, are disposed and formed in an isosceles triangular shape in a plan view.

[2] The method for manufacturing a Group III nitride semiconductor light-emitting element according to [1], wherein when disposing and forming the three arbitrary convex portions in the isosceles triangular shape in a plan view, a vertex angle of the isosceles triangular shape may be within a range of 45° to 75°.

[3] The method for manufacturing a Group III nitride semiconductor light-emitting element according to [1] or [2], wherein in the substrate-processing process, the mask patterns may be sequentially formed in the respective regions of the flat surface of the substrate using the reticle having a parallelogram shape in a plan view, and the flat surface is etched to form the plurality of convex portions.

[4] The method for manufacturing a Group III nitride semiconductor light-emitting element according to [1] or [2], wherein in the substrate-processing process, the mask patterns are sequentially formed in the respective regions of the flat surface of the substrate using the reticle having a hexagonal shape in a plan view, and the flat surface is etched to form the plurality of convex portions.

[5] The method for manufacturing a Group III nitride semiconductor light-emitting element according to any one of [1] to [4], wherein the mask patterns may be formed on the flat surface of the substrate while sequentially moving the reticle in a state in which one side of the reticle is inclined with respect to a cleavage direction of the substrate at an angle of 5° to 25° in a planar direction of the substrate.

[6] The method for manufacturing a Group III nitride semiconductor light-emitting element according to [5], wherein in the substrate-processing process, as the reticle, a reticle in which a cut-out portion is formed on at least one arbitrary corner portion among corner portions of the reticle may be used, and the mask patterns may be formed on the surface of the substrate while moving the reticle in such a manner that a position of the cut-out portion of the reticle and a position of at least one corner portion among the corner portions of the reticle after the movement overlap each other during sequential movement of the reticle on the substrate according to a stepper exposure method.

[7] The method for manufacturing a Group III nitride semiconductor light-emitting element according to any one of [1] to [6], wherein in the substrate-processing process, the convex portions may be formed to have the base width $d_1$ within a range of 0.05 to 1.5 μm, and the height h within a range of 0.05 to 1 μm.

[8] The method for manufacturing a Group III nitride semiconductor light-emitting element according to any one of [1] to [7], wherein in the substrate-processing process, the convex portions may be formed in such a manner that the height h becomes ¼ or more times the base width $d_1$, and a distance $d_2$ between the convex portions adjacent to each other becomes 0.5 to 5 times the base width $d_1$.

[9] The method for manufacturing a Group III nitride semiconductor light-emitting element according to any one of [1] to [8], wherein in the substrate-processing process, the convex portions may be formed to have a shape in which an external shape thereof becomes gradually smaller toward the vertex portion.

[10] The method for manufacturing a Group III nitride semiconductor light-emitting element according to any one of [1] to [9], wherein in the substrate-processing process, the convex portions may be formed in a conical shape or a polygonal pyramid shape.

[11] The method for manufacturing a Group III nitride semiconductor light-emitting element according to any one of [1] to [10], wherein the method may further include a buffer layer-forming process of laminating a buffer layer, which is formed from a single crystalline or polycrystalline $Al_xGa_{1-x}N$ ($0 \leq x \leq 1$) and has a thickness of 0.01 to 0.5 μm, on the main surface of the substrate according to a sputtering method after the substrate-processing process and before the epitaxial process.

[12] The method for manufacturing a Group III nitride semiconductor light-emitting element according to any one of [1] to [11], wherein in the LED lamination process, the LED structure may be formed by laminating an n-type semiconductor layer, a light-emitting layer, and a p-type semiconductor layer that are formed from a Group III nitride semiconductor, respectively, in this order on the Group III nitride semiconductor layer that is formed on the main surface of the substrate.

[13] A Group III nitride semiconductor light-emitting element that is obtained according to the manufacturing method according to any one of [1] to [12].

A lamp in which the Group III nitride semiconductor light-emitting element according to [13] is used.

[15] A reticle that forms mask patterns configured to periodically arrange and form a plurality of convex portions in a flat surface of a substrate by performing transfer on the flat surface of the substrate formed from sapphire according to a stepper exposure method, wherein a shape of the reticle in a plan view is a polygonal shape having two pairs of parallel opposing ends, transfer patterns, which are configured to form the plurality of convex portions in the flat surface of the substrate, are arranged to be parallel with the two pairs of parallel ends of the reticle, respectively, and to be periodic in two axial directions of one arrangement axis and the other arrangement axis intersecting each other, and the transfer patterns are formed as a pattern configured to dispose three arbitrary convex portions, which are adjacent to each other and are arranged in a triangular shape in a plan view, among the plurality of convex portions formed in the flat surface of the substrate in an isosceles triangular shape in a plan view.

[16] The reticle according to [15], wherein a cut-out portion may be formed on at least one arbitrary corner portion among corner portions of a polygonal shape constructed by two pairs of parallel opposing ends in a plan view.

[17] The reticle according to [15] or [16], wherein the shape in a plan view may be a parallelogram shape.

[18] The reticle according to [15] or [16], wherein the shape in a plan view is a hexagonal shape.

According to the method for manufacturing the Group III nitride semiconductor light-emitting element of the invention, the method including the substrate-processing process of forming the main surface including the flat surface and the convex portions in the substrate is adopted In the substrate-processing process, the mask patterns are sequentially formed in the respective regions of the flat surface, which is formed from the (0001) C-plane, of the substrate using the polygonal reticle having two pairs of parallel opposing ends in a plan view by the stepper exposure method. Then, the flat surface is etched. According to this, in an in-plane direction of the flat surface of the substrate, the plurality of the convex portions are arranged to be parallel with the two pairs of parallel ends of the reticle, respectively, and to be periodic in two axial directions of one arrangement axis and the other arrangement axis intersecting each other. In addition, among the plurality of convex portions, three arbitrary convex portions, which are adjacent to each other and are arranged in a triangular shape in a plan view, are disposed in an isosceles triangular shape in a plan view. When the method including the above-described substrate-processing process is adopted, occurrence of deformation or deficiency of the convex portions in the substrate may be suppressed, and at the same time, a linear convex portion may be prevented from being generated in the substrate. According to this, occurrence of a partial modification in each layer, which is formed on the main surface of the substrate, may be suppressed, and thus external appearance properties of the light-emitting element are improved, and occurrence of dislocation in each layer of the LED structure formed on the Group III nitride semiconductor layer is suppressed. Accordingly, the crystallinity is improved, and thus the internal quantum efficiency is improved. In addition, when the deformation or deficiency of the convex portions is suppressed, the light confinement inside the light-emitting element due to scattered reflection of light is reduced. As a result, the light extraction efficiency is improved.

Accordingly, the Group III nitride semiconductor light-emitting element, in which the internal quantum efficiency and the light extraction efficiency are high, and which has excellent light-emitting properties and external appearance properties, may be manufactured with high productivity.

In addition, since the Group III nitride semiconductor light-emitting element of the invention is obtained according to the method for manufacturing the Group III nitride semiconductor light-emitting element of the invention, according to the Group III nitride semiconductor light-emitting element of the invention, the internal quantum efficiency and the light extraction efficiency are high, and thus excellent light-emitting properties may be obtained.

Furthermore, since the Group III nitride semiconductor light-emitting element of the invention is used, the lamp related to the invention has excellent light-emitting properties.

In addition, according to the reticle of the invention, the external shape thereof is set to a polygonal shape having two pairs of parallel opposing ends in a plan view, and the transfer patterns, which are configured to periodically arrange and form the plurality of convex portions in the flat surface of the substrate, are arranged to be parallel with the two pairs of parallel ends of the reticle, respectively, and to be periodic in two axial directions of one arrangement axis and the other arrangement axis intersecting each other. In addition, the reticle adapts a pattern configuration to dispose three arbitrary convex portions, which are adjacent to each other and are arranged in a triangular shape in a plan view, among the plurality of convex portions formed in the flat surface of the substrate in an isosceles triangular shape in a plan view. When the main surface including the flat surface and the convex portions is formed in the substrate using this reticle, and the Group III nitride semiconductor is epitaxially grown to cover the main surface, thereby manufacturing the Group III nitride semiconductor light-emitting element, the Group III nitride semiconductor light-emitting element, in which the internal quantum efficiency and the light extraction efficiency are high, and which has excellent light-emitting properties and the external appearance properties as described above, may be manufactured.

DETAILED DESCRIPTION OF THE INVENTION

Figure 1:
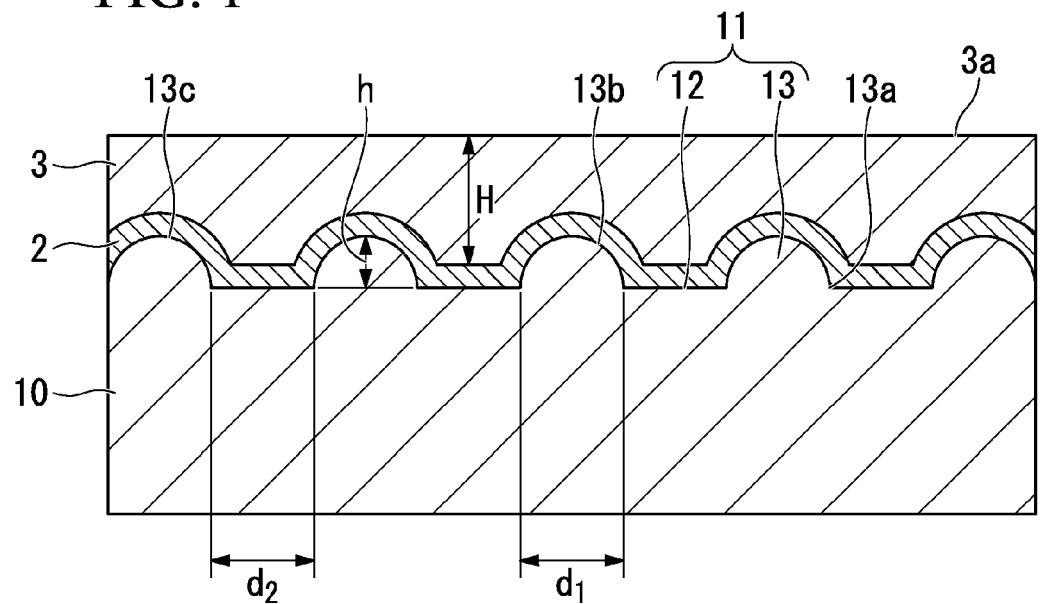
FIG. 1 is a view schematically explaining an example of a method for manufacturing a Group III nitride semiconductor light-emitting element, and a Group III nitride semiconductor light-emitting element related to the invention, and is a cross-sectional view illustrating a laminated structure in which a buffer layer and an underlying layer formed from a single crystalline Group III nitride semiconductor are formed on a main surface of a substrate.

Hereinafter, an embodiment of a method for manufacturing a Group III nitride semiconductor light-emitting element (hereinafter, may be abbreviated to a light-emitting element), a Group III nitride semiconductor light-emitting element, a lamp, and a reticle will be described while appropriately referring to the drawings.

The method for manufacturing the Group III nitride semiconductor light-emitting element related to the invention is a method in which a single crystalline underlying layer (a Group III nitride semiconductor layer) 3 is formed on a substrate 10 formed from sapphire, and an LED structure 20 is formed on the underlying layer 3. Specifically, the method includes a substrate-processing process of periodically forming a plurality of convex portions 13 having a base width $d_1$ and a height h in a flat surface 12, which is formed from a (0001) C-plane, of the substrate 10 to form a main surface 11 including the flat surface 12 and the convex portions 13 in the substrate 10, an epitaxial process of epitaxially growing the underlying layer 3 on the main surface 11 of the substrate 10 so as to cover the flat surface 12 and the convex portions 13, and an LED lamination process of forming the LED structure 20 by epitaxially growing the Group III nitride semiconductor subsequently to the epitaxial process. Furthermore, the substrate-processing process includes a patterning process of sequentially forming mask patterns 15 in respective regions R1 and R2 of the flat surface 12 using a polygonal reticle (photomask) 51 that has two pairs of parallel opposing ends in a plan view and is configured in a parallelogram shape in a plan view in an example shown in FIG. 6 and the like by a stepper exposure method, and an etching process of forming the plurality of convex portions 13 by etching the flat surface 12 using the mask patterns 15. In an in-plane direction of the flat surface 12 of the substrate 10, the plurality of the convex portions 13 are arranged to be parallel with the two pairs of parallel ends 51a, 51b, 51c, and 51d of the reticle 51, respectively, and to be periodic in two axial directions of one arrangement axis J1 and the other arrangement axis J2 intersecting each other. In addition, among the plurality of convex portions 13, three arbitrary convex portions 13, which are adjacent to each other and are arranged in a triangular shape in a plan view, are disposed and formed in an isosceles triangular shape in a plan view.

Figure 6:
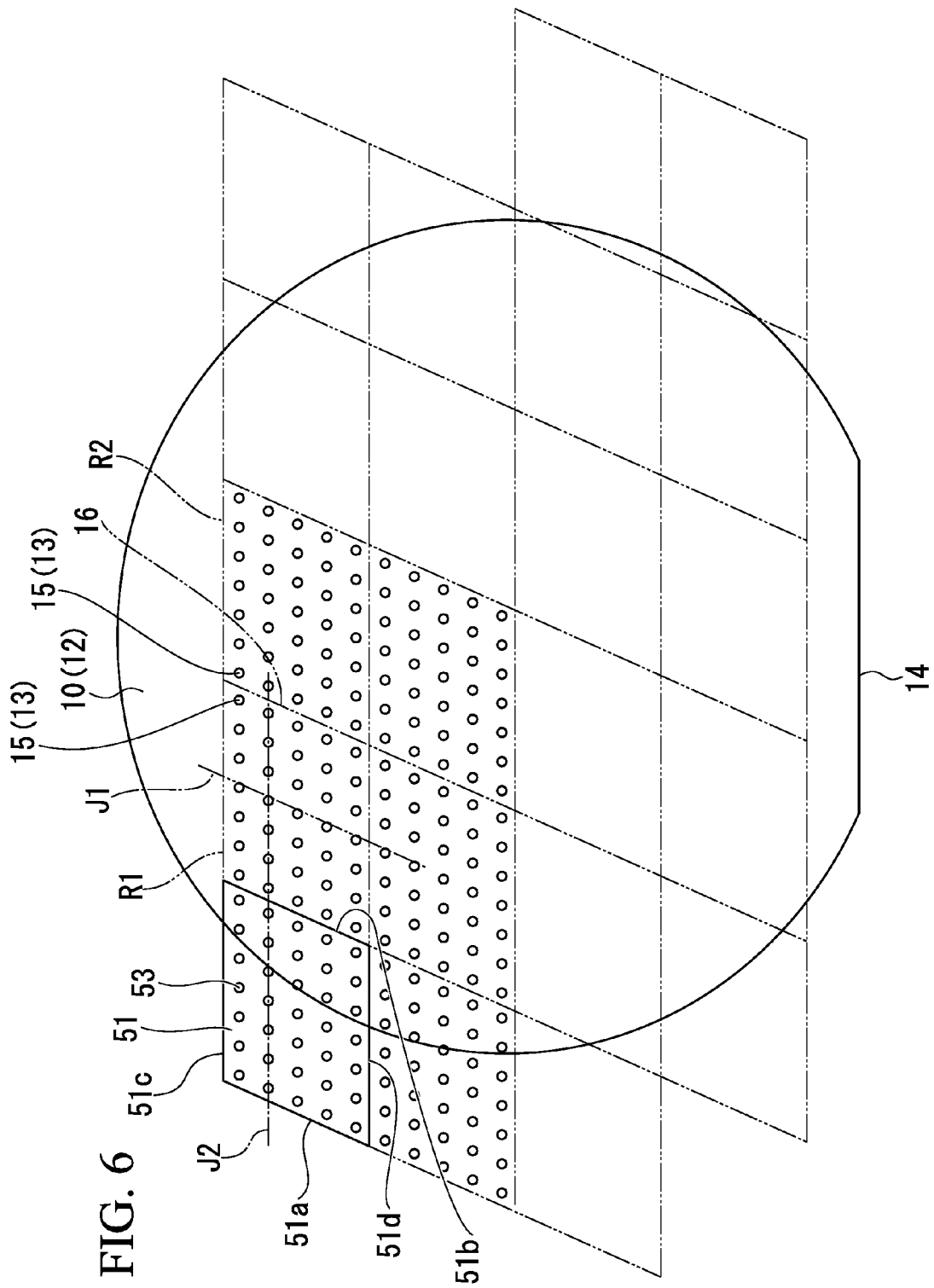
FIG. 6 is a view schematically explaining the example of the method for manufacturing the Group III nitride semiconductor light-emitting element, the Group III nitride semiconductor light-emitting element, and a reticle that are related to the invention, and is a plan view schematically illustrating a substrate-processing process of forming a plurality of convex portions in the surface of the substrate while sequentially moving the reticle having a parallelogram shape in a plan view.

In addition, in the invention, the two pairs of parallel "ends" of the reticle represent two pairs of parallel "sides" of the reticle in a plan view. For example, in a case of the reticle 51 configured in the parallelogram shape in a plan view as shown in FIG. 6, the ends 51a and 51b become a pair of parallel sides. Similarly, the ends 51c and 51d become a pair of parallel sides.

Group III Nitride Semiconductor Light-Emitting Element

Hereinafter, an example of a light-emitting element that may be obtained according to the manufacturing method of the invention will be described referring to FIGS. 1 to 4 (also, appropriately referring to FIGS. 5 and 6).

Figure 2:
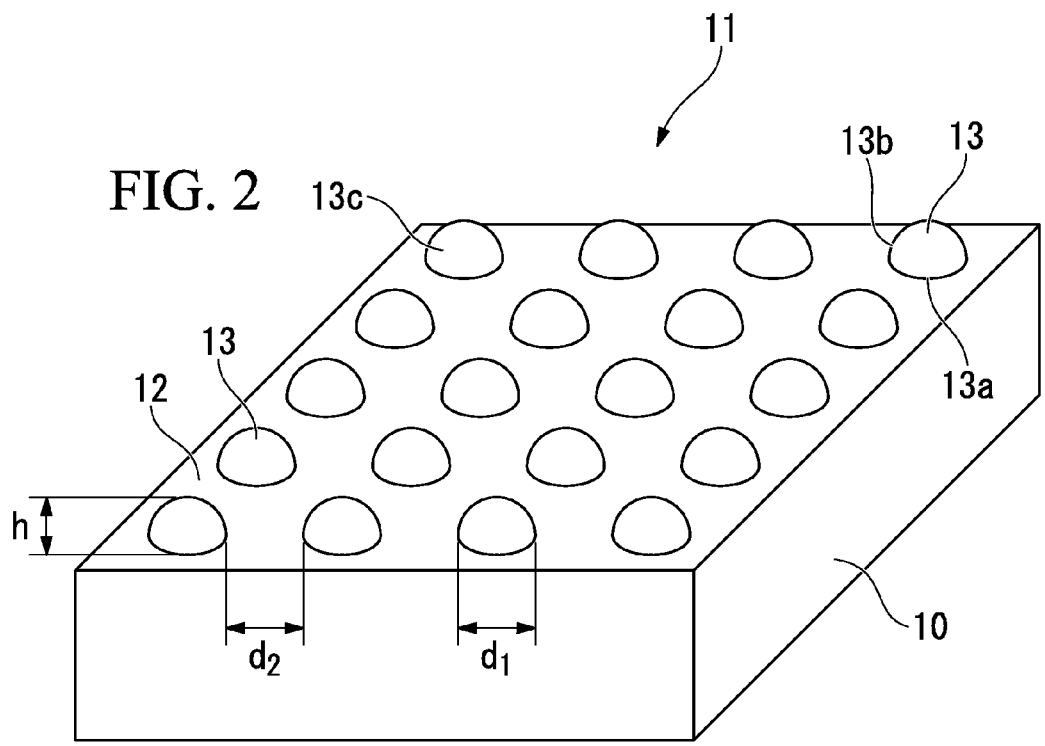
FIG. 2 is a view schematically explaining the example of the method for manufacturing the Group III nitride semiconductor light-emitting element, and the Group III nitride semiconductor light-emitting element that are related to the invention, and is a perspective view illustrating a main portion of FIG. 1.

FIGS. 1 and 2 show views illustrating a main portion of a light-emitting element 1 (refer to FIG. 3) that is an example obtained by the manufacturing method of the invention. FIG. 1 shows a cross-sectional view illustrating a laminated structure in which a buffer layer 2 and a single crystalline underlying layer (Group III nitride semiconductor layer) 3 are formed on the main surface 11 of the substrate 10. FIG. 2 shows a perspective view illustrating the substrate 10 shown in FIG. 1.

Figure 3:
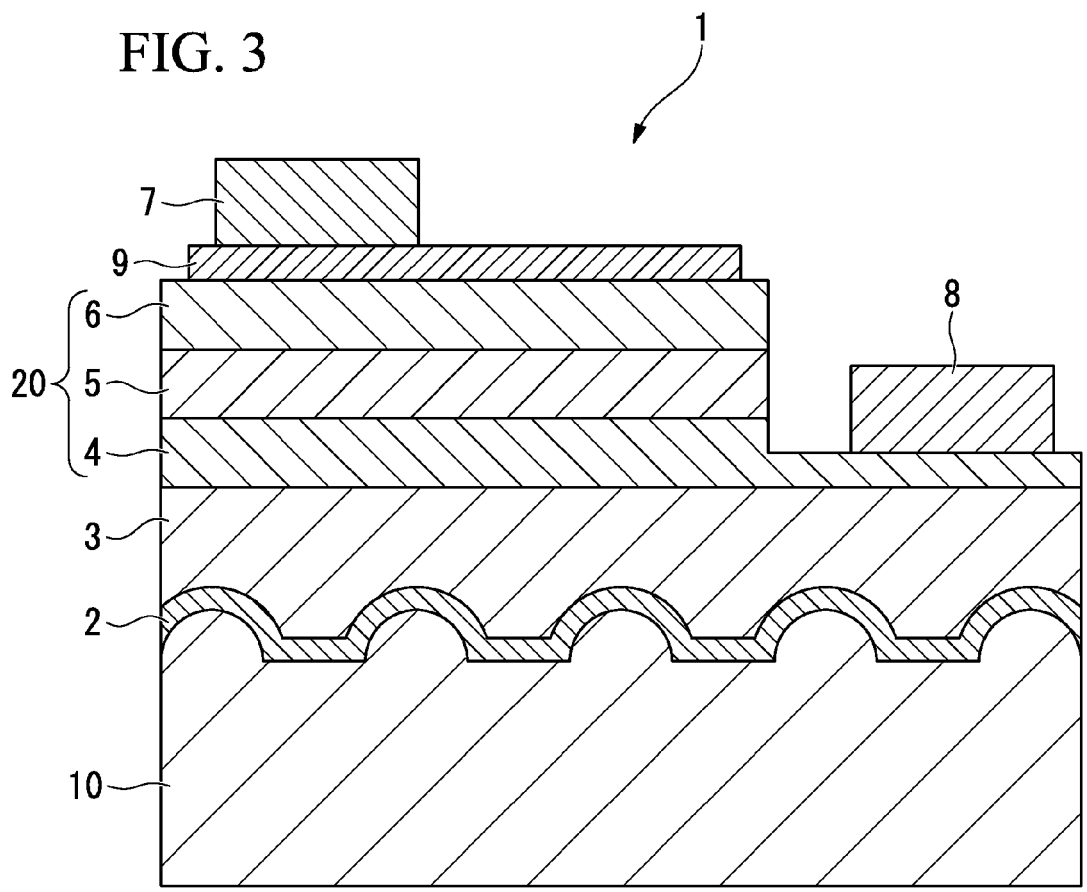
FIG. 3 is a view schematically explaining the example of the method for manufacturing the Group III nitride semiconductor light-emitting element, and the Group III nitride semiconductor light-emitting element that are related to the invention, and is a cross-sectional view illustrating a structure of the light-emitting element in which an LED structure is formed on the laminated structure shown in FIG. 1.
Figure 4:
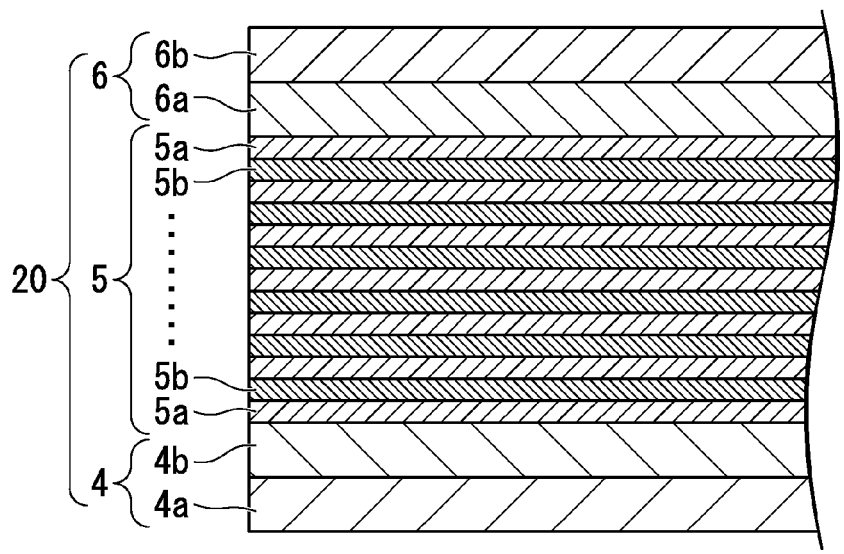
FIG. 4 is a view schematically explaining the example of the method for manufacturing the Group III nitride semiconductor light-emitting element, and the Group III nitride semiconductor light-emitting element that are related to the invention, and is an enlarged cross-sectional view illustrating a main portion of FIG. 3.

In addition, FIG. 3 shows a cross-sectional view illustrating the light-emitting element 1 in which the LED structure 20 is formed on the underlying layer (Group III nitride semiconductor layer) 3 having the laminated structure shown in FIG. 1. In the drawings, a reference numeral 7 represents a positive-electrode bonding pad, and a reference number 8 represents a negative-electrode bonding pad. In addition, FIG. 4 shows a partial cross-sectional view illustrating a laminated structure of an n-type semiconductor layer 4, a light-emitting layer 5, and a p-type semiconductor layer 6 of the light-emitting element 1 shown in FIG. 3.

In addition, similarly to the example shown in FIGS. 1 to 4, in the light-emitting element 1, the LED structure 20 is formed on the single crystalline underlying layer (Group III nitride semiconductor layer) 3 that is formed on the substrate 10. The substrate 10 has the main surface 11 including the flat surface 12 formed from the (0001) C-plane, and the plurality of convex portions 13 having a surface 13c that is not parallel with the C-plane. A base width of the convex portions 13 is 0.05 to 1.5 µm, and a height h is 0.05 to 1 µm. In addition, the underlying layer 3 is formed by epitaxially growing a Group III nitride semiconductor on the main surface 11 of the substrate 10 so as to cover the flat surface 12 and the convex portions 13. In addition, in the example described in this embodiment, the buffer layer 2 is formed on the substrate 10, and the underlying layer 3 is formed on the buffer layer 2.

Similarly to the example shown in FIG. 3, the light-emitting element 1 described in this embodiment is a single-surface electrode type, and the buffer layer 2 and the LED structure (Group III nitride semiconductor layer) 20 formed from a Group III nitride semiconductor containing Ga as a Group III element are formed on the above-described substrate 10. In addition, in the LED structure 20 that is provided to the light-emitting element 1, as shown in FIG. 3, respective layers of the n-type semiconductor layer 4, the light-emitting layer 5, and the p-type semiconductor layer 6 are laminated in this order.

Substrate

In the light-emitting element of this embodiment, a material, which may be used for the above-described substrate 10, is not particularly limited as long as a Group III nitride semiconductor crystal can be epitaxially grown on a surface of the substrate 10, and various materials may be selectively used. For example, examples of the material of the substrate 10 include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, and the like. In addition, it is particularly preferable to use sapphire among the above-described substrate materials.

Similarly to the example shown in FIG. 2, the plurality of convex portions 13 are formed in the substrate 10 that is used in this embodiment. In addition, with regard to the main surface 11 of the substrate 10, a portion at which the convex portions 13 are not formed is configured as the flat surface 12 formed from the (0001) C-plane. Accordingly, similarly to the example shown in FIGS. 1 and 2, the main surface 11 of the substrate 10 includes the flat surface 12 formed from the C-plane, and the plurality of the convex portions 13.

As shown in FIGS. 1 and 2, each of the convex portions 13 has a surface 13c that is not parallel with the C-plane, and the C-plane does not appear in the convex portions 13. The convex portions 13, which are shown in FIGS. 1 and 2, have a bowl container shape (a hemispheric shape) in which a planar shape of a base 13a is a circular shape, an external shape thereof becomes gradually smaller toward the vertex portion, and a side surface 13b is curved toward the outside. Here, the "planar shape of the base 13a is a circular shape" is not limited to a strict circular shape, and may be an elliptical shape. In addition, in the invention, as shown in FIGS. 1 and 2, with regard to a planar disposition of the convex portions 13, the convex portions 13 may be disposed in a grid shape at an equal interval. However, as shown in FIG. 6 and the like, it is preferable that three arbitrary convex portions 13, which are adjacent to each other and are arranged in a triangular shape in a plan view, among the plurality of convex portions 13 be disposed in an isosceles triangular shape.

In addition, in the plurality of the convex portions 13 that are disposed in the substrate 10 in the isosceles triangular shape in a plan view, it is more preferable that a vertex angle of the isosceles triangular shape be within a range of 45° to 75°. This range of the vertex angle is an optically preferable range because the convex portions 13 may be formed with high density in the flat surface 12. In addition, a more preferable range of the above-described vertex angle is a range of 52° to 68°, and it is more preferable that the convex portions 13 be disposed in an equilateral triangular shape in a plan view from the viewpoint that the convex portions 13 may be disposed with the highest density. Here, from the viewpoint of crystal growth of the Group III nitride semiconductor on the substrate, it is still more preferable that distances between the respective convex portions 13 be the same as each other. When a difference in the distance between the respective convex portions becomes large, the crystallinity decreases, and there is a problem in that the light-emitting efficiency decreases. From these viewpoints, the disposition in the equilateral triangular shape, in which the vertex angle is approximately 60° and the distances between the respective convex portions are approximately the same as each other, is still more preferable.

Furthermore, it is still more preferable that a disposition pattern of the convex portions 13 be the equilateral triangular shape having the vertex angle of approximately 60° as described above also from the viewpoint of satisfactory crystal growth. This is because when distances between the respective convex portions are different from each other, flattening of the Group III nitride semiconductor that grows thereon becomes difficult, and thus the crystallinity decreases. In addition, a preferable range of the vertex angle from the viewpoint of crystal growth is also 52° to 68° as described above. In addition, in the invention, the disposition pattern of the convex portions 13 is defined to the isosceles triangular shape in a plan view. However, when the vertex angle at this time is set within a broad range of 45° to 75°, it is more preferable to appropriately select growth conditions of a layer that is formed on the substrate 10.

Figure 5:
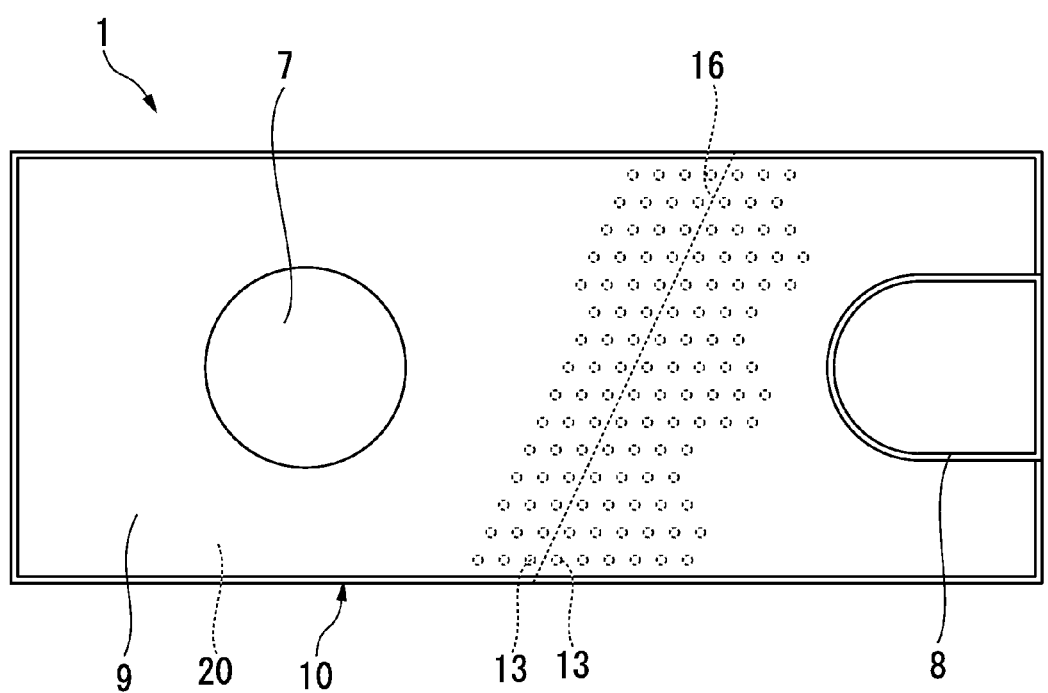
FIG. 5 is a view schematically explaining the example of the method for manufacturing the Group III nitride semiconductor light-emitting element, and the Group III nitride semiconductor light-emitting element that are related to the invention, and is a schematic plan view illustrating a surface state of the light-emitting element and a surface state of the substrate.

In addition, similarly to an example shown in FIG. 5, in the substrate 10 that is used in this embodiment, a joint line 16 is present on the main surface 11. The joint line 16 is derived from a pitch 52 when the reticle 51 (refer to FIG. 6) is sequentially moved on the flat surface 12 in the substrate-processing process of forming the mask patterns 15 by a manufacturing method to be described later in detail. The joint line 16 is also derived from the external shape of the reticle 51, and is present on the substrate 10 at positions corresponding to the two pairs of parallel ends 51a, 51b, 51c, and 51d of the reticle 51.

In addition, in the example described in this embodiment, the convex portions 13 are arranged in the substrate 10 to be parallel with each joint line 16 and to be periodic in two axial directions of one arrangement axis J1 and the other arrangement axis J2 intersecting each other in the in-plane direction of the flat surface 12.

In addition, in the convex portions 13 of the example shown in FIGS. 1 and 2, the base width $d_1$ is set within a range of 0.05 to 1.5 µm, the height h is set within a range of 0.05 to 1 µm, the height h is set to ¼ or more times the base width $d_1$, and a distance $d_2$ between the convex portions 13 adjacent to each other is set to 0.5 to 5 times the base width $d_1$. Here, the base width $d_1$ of the convex portion 13 represents the maximum diameter at the bottom (base 13a) of each of the convex portions 13. In addition, the distance $d_2$ between the convex portions 13 that are adjacent to each other represents a distance between edges of the bases 13a of the respective convex portions 13 that are the most adjacent to each other.

It is preferable that the distance $d_2$ between the respective convex portions 13 that are adjacent to each other be set to 0.5 to 5 times the base width $d_1$. When the distance $d_2$ between the respective convex portions 13 is less than 0.5 times the base width $d_1$, it is difficult for crystal growth from the flat surface 12 formed from the C-plane to be promoted during epitaxial growth of the underlying layer 3, and thus it is difficult for the convex portions 13 to be completely buried with the underlying layer 3. Furthermore, flatness of a surface 3a of the underlying layer 3 may not be sufficiently obtained. Therefore, when the convex portions 13 are buried with the underlying layer 3, and the crystal of the semiconductor layer that makes up the LED structure is formed on the underlying layer 3, a lot of pits are naturally formed in this crystal. As a result, this leads to deterioration in an output, electrical properties, and the like of the Group III nitride semiconductor light-emitting element that is formed. In addition, when the distance $d_2$ between the convex portions 13 exceeds five times the base width $d_1$, in a case of forming the Group III nitride semiconductor light-emitting element using the substrate 10, a chance for scattered reflection of light at an interface between the substrate 10 and the Group III nitride semiconductor layer formed on the substrate 10 decreases, and thus there is a concern that the light extraction efficiency may not be sufficiently improved.

It is preferable that the base width $d_1$ be set to 0.05 to 1.5 μm. When the base width $d_1$ is less than 0.05 μm, in a case of forming the Group III nitride semiconductor light-emitting element using the substrate 10, there is a concern that the scattered reflection effect of light may not be sufficiently obtained. In addition, when the base width $d_1$ exceeds 1.5 μm, when the underlying layer 3 is epitaxially grown while burying the convex portions 13, a portion that is not flattened may occur or a growth time increases, and thus productivity decreases.

In addition, when the base width $d_1$ is configured to be relatively smaller within the above-described range, an effect of further improving the light-emitting output of the light-emitting element may be obtained.

It is preferable that the height h of the convex portions 13 be set to 0.05 to 1 μm. When the height h of the convex portions 13 is less than 0.05 μm, in a case of forming the Group III nitride semiconductor light-emitting element using the substrate 10, there is a concern that the scattered reflection effect of light may not be sufficiently obtained. In addition, when the height h of the convex portions 13 exceeds 1 μm, it is difficult for the underlying layer 3 to be epitaxially grown while burying the convex portions 13, and thus flatness of the surface 3a of the underlying layer 3 may not be sufficiently obtained.

In addition, it is preferable that the height h of the convex portions 13 be set to ¼ or more times the base width $d_1$. When the height h of the convex portions 13 is less than ¼ times the base width $d_1$, in a case of forming the in a case of forming the Group III nitride semiconductor light-emitting element using the substrate 10, there is a concern that the scattered reflection effect of light or the light extraction efficiency may not be sufficiently obtained.

In addition, the shape of the convex portions 13 is not limited to the example shown in FIGS. 1 and 2, and may be any shape as long as the convex portions 13 have a surface that is not parallel with the C-plane. For example, the convex portions 13 may have a shape in which a planar shape of the base is a polygonal shape, an external shape thereof becomes gradually smaller toward the vertex portion, and the side surface 13b is curved toward the outside. Here, the "planar shape of the base is a polygonal shape" described in this embodiment is not limited to a strict polygonal shape, and may be a polygonal shape having a round corner. In addition, the shape of the convex portions 13 may be a conical shape or a polygonal pyramid shape in which the side surface is formed from an inclined surface whose external shape becomes gradually smaller toward the vertex. Here, the conical shape or the polygonal pyramid shape is not limited to a strict conical shape or polygonal pyramid shape. In addition, the shape of the convex portions 13 may be a shape in which an inclination angle of the side surface varies in two stages.

In the invention, when the substrate 10 is configured to have the main surface 11 including the flat surface 12 and the convex portions 13 as described above, the interface between the substrate 10 and the underlying layer 3 to be described later in detail becomes a concavo-convex interface with the buffer layer 2 interposed therebetween. Accordingly, the light confinement inside the light-emitting element is reduced due to scattered reflection of light, and thus the light-emitting element 1 having excellent light extraction efficiency may be realized. In addition, when the substrate 10 is configured as described above, crystallinity of the buffer layer 2 and the underlying layer 3 is improved due to an operation to be described later in detail, and thus the crystallinity of the LED structure 20 that is formed thereon becomes excellent.

Buffer Layer

In the invention, it is preferable that the buffer layer 2 be formed on the main surface 11 of the substrate 10, and the underlying layer 3 to be described later be formed thereon. The buffer layer 2 has a function of mitigating a difference in a lattice constant between the substrate 10 and the underlying layer 3, and of making a C-axially oriented single crystalline layer be easily formed on the C-plane of the substrate 10.

The buffer layer 2 is laminated in a composition of $Al_xGa_{1-x}N$ ($0 \leq x \leq 1$) on the substrate 10, and may be formed, for example, according to a reactive sputtering method.

It is preferable that the film thickness of the buffer layer 2 be set within a range of 0.01 to 0.5 μm. When the film thickness of the buffer layer 2 is set within this range, it is possible to obtain the buffer layer 2 that has a satisfactory orientation property and effectively functions as a coat layer during formation of each layer formed from the Group III nitride semiconductor on the buffer layer 2. When the film thickness of the buffer layer 2 is less than 0.01 μm, a sufficient function as the above-described coat layer may not be obtained, and the buffering operation of mitigating the difference in the lattice constant between the substrate 10 and the underlying layer 3 may not be sufficiently obtained. In addition, in a case of forming the butter layer 2 in the film thickness exceeding 0.5 μm, even though the buffering operation or the function as the coat layer does not vary, a film formation treatment time increases and thus productivity may deteriorate. In addition, it is more preferable that the film thickness of the buffer layer 2 be set within a range of 0.02 to 0.1 μm.

Group III Nitride Semiconductor Layer (Underlying Layer)

The underlying layer (Group III nitride semiconductor layer) 3, which is provided to the light-emitting element 1 of the invention, is formed from the Group III nitride semiconductor, and may be formed by laminating the Group III nitride semiconductor on the buffer layer 2 according to, for example, an MOCVD method in the related art. In addition, as described above, the underlying layer 3, which is described in this example, is formed by causing the Group III nitride semiconductor to be epitaxially grown on the main surface 11 of the substrate 10 through the buffer layer 2 so as to cover the flat surface 12 and the convex portions 13.

As a material of the underlying layer 3, for example, $Al_xGa_yIn_zN$ ($0 \leq x \leq 1$, $0 \leq y \leq 1$, $0 \leq z \leq 1$, and $x+y+z=1$) may be used, but it is preferable to use $Al_yGa_{1-y}N$ layer ($0 \leq y \leq 1$, preferably $0 \leq y \leq 0.5$, and more preferably $0 \leq y \leq 0.1$) from the viewpoint of forming the underlying layer 3 with satisfactory crystallinity.

The underlying layer 3 may have a configuration doped with an n-type impurity within a range of $1 \times 10^{17}$ to $1 \times 10^{19}$ pieces/cm$^3$ as necessary, but may have an undoped configuration ($<1 \times 10^{17}$ pieces/cm$^3$). The undoped configuration is preferable from the viewpoint of maintaining satisfactory crystallinity.

In the invention, it is more preferable that the maximum thickness H of the underlying layer 3 be set within a range of 1.5 to 4.5 µm from the viewpoint that the above-described effect and productivity may be compatible with each other. When the maximum thickness H, which is the thickness of the underlying layer 3 at the position of the flat surface 12 of the substrate 10, is too large, there is a problem in that a process time increases or the n-type semiconductor layer 4 does not have a sufficient film thickness.

In addition, it is more preferable that the maximum thickness H of the underlying layer 3 be two or more times the height h of the convex portions 13 of the substrate 10 from the viewpoint that flatness of the surface 3a is improved. When the maximum thickness H of the underlying layer 3 is less than two times the height h of the convex portions 13, the flatness of the surface 3a of the underlying layer 3, which is grown to cover the convex portions 13, may be insufficient.

In the invention, the interface between the substrate 10 and the underlying layer 3 becomes a concavo-convex interface with the buffer layer 2 interposed therebetween, the light confinement inside the light-emitting element decreases due to the scattered reflection of light, and thus the light-emitting element having excellent light extraction efficiency may be realized.

LED Structure

The LED structure 20 includes the n-type semiconductor layer 4, the light-emitting layer 5, and the p-type semiconductor layer 6 that are formed from the Group III nitride semiconductor, respectively. When each layer of the LED structure 20 is formed by the MOCVD method, the crystallinity thereof may be relatively increased.

n-Type Semiconductor Layer

Commonly, the n-type semiconductor layer 4 includes an n-type contact layer 4a and an n-type clad layer 4b. In addition, the n-type contact layer 4a may also function as the n-type clad layer 4b.

The n-type contact layer 4a is a layer to provide a negative electrode. It is preferable that the n-type contact layer 4a be formed from $Al_xGa_{1-x}N$ layer ($0 \leq x < 1$, preferably $0 \leq x \leq 0.5$, and more preferably $0 \leq x \leq 0.1$). In addition, it is preferable that the n-type contact layer 4a be doped with an n-type impurity. It is preferable that the n-type impurity be contained in a concentration of $1 \times 10^{17}$ to $1 \times 10^{20}$/cm$^3$, and more preferably in a concentration of $1 \times 10^{8}$ to $1 \times 10^{19}$/cm$^3$, from the viewpoint of maintaining satisfactory ohmic contact with a negative electrode. Although not particularly limited, preferable examples of this n-type impurity include Si, Ge, Sn, and the like, Si and Ge.

It is preferable that the film thickness of the n-type contact layer 4a be set to 0.5 to 5 µm, and more preferably within a range of 1 to 3 µm. When the film thickness of the n-type contact layer 4a is within the above-described range, the crystallinity of the semiconductor is satisfactorily maintained.

It is preferable that the n-type clad layer 4b be provided between the n-type contact layer 4a and the light-emitting layer 5. The n-type clad layer 4b is a layer that performs carrier implantation into the light-emitting layer 5 and carrier confinement therein. The n-type clad layer 4b may be formed from AlGaN, GaN, GaInN, or the like. In addition, the n-type clad layer 4b may have a heterojunction of the above-described structure, or a superlattice structure laminated plural times. In addition, in a case of forming the n-type clad layer 4b with GaInN, it is preferable that a bandgap be larger than that of GaInN of the light-emitting layer 5.

Although not particularly limited, it is preferable that the film thickness of the n-type clad layer 4b be 0.005 to 0.5 µm, and more preferably 0.005 to 0.1 µm. In addition, it is preferable that an n-type doping concentration of the n-type clad layer 4b be $1 \times 10^{17}$ to $1 \times 10^{20}$/cm$^3$, and more preferably $1 \times 10^{18}$ to $1 \times 10^{19}$/cm$^3$. When the n-type doping concentration of the n-type clad layer 4b is within this range, this is preferable from the viewpoints of maintaining satisfactory crystallinity and a decrease in an operation voltage of an element.

In addition, the n-type clad layer 4b may be a layer including the superlattice structure.

Light-Emitting Layer

Examples of the light-emitting layer 5 that is laminated on the n-type semiconductor layer 4 include a light-emitting layer 5 having a single-quantum-well structure, a multiple-quantum-well structure, or the like. As a well layer having the multiple-quantum-well structure as shown in FIG. 4, in a case of a configuration that exhibits blue light emission, a Group III nitride semiconductor having a composition of $Ga_{1-y}In_yN$ ($0<y<0.4$) is commonly used, but in a case of a well layer that exhibits green light emission, a material in which a composition of indium increases is used.

As a barrier layer 5a, $Al_zGa_{1-z}N$ ($0 \leq z < 0.3$) having bandgap energy larger than that of a well layer 5b is suitably used.

p-Type Semiconductor Layer

Commonly, the p-type semiconductor layer 6 includes a p-type clad layer 6a and a p-type contact layer 6b. In addition, the p-type contact layer 6b may also function as the p-type clad layer 6a.

The p-type clad layer 6a is a layer that performs carrier confinement in the light-emitting layer 5 and carrier implantation thereto. A composition of the p-type clad layer 6a is not particularly limited as long as the carrier confinement in the light-emitting layer 5 may be realized in a composition in which bandgap energy of the p-type clad layer 6a becomes larger than that of the light-emitting layer 5, but preferable examples of the composition include $Al_xGa_{1-x}N$ ($0<x \leq 0.4$). When the p-type clad layer 6a is formed from this AlGaN, this is preferable from the viewpoint of the carrier confinement in the light-emitting layer. In addition, although not particularly limited, it is preferable that the film thickness of the p-type clad layer 6a be 1 to 400 nm, and more preferably 5 to 100 nm. In addition, it is preferable that a p-type doping concentration of the p-type clad layer 6a be $1 \times 10^{18}$ to $1 \times 10^{21}$/cm$^3$, and more preferably $1 \times 10^{19}$ to $1 \times 10^{20}$/cm$^3$. When the p-type doping concentration of the p-type clad layer 6a is within the above-described range, a satisfactory p-type crystal may be obtained without deteriorating crystallinity.

In addition, the p-type clad layer 6a may have a superlattice structure in which layers having compositions different from each other are laminated plural times.

The p-type contact layer 6b is a layer to provide a positive electrode. It is preferable that the p-type contact layer 6b is formed from $Al_xGa_{1-x}N$ ($0 \leq x \leq 0.4$). When an Al composition in the p-type contact layer 6b is within the above-described range, this is preferable from the viewpoints of maintaining satisfactory crystallinity and satisfactory ohmic contact with a p ohmic electrode. It is preferable that the p-type contact layer 6b contain a p-type impurity (dopant) in a concentration of $1 \times 10^{18}$ to $1 \times 10^{21}/cm^3$, and more preferably $5 \times 10^{19}$ to $5 \times 10^{20}/cm^3$ from the viewpoints of maintaining satisfactory ohmic contact, prevention of occurrence of cracking, and maintaining satisfactory crystallinity. Although not particularly limited, preferable examples of the p-type impurity include Mg. In addition, although not particularly limited, it is preferable that the film thickness of the p-type contact layer 6b be 0.01 to 0.5 μm, and more preferably 0.05 to 0.2 μm. When the film thickness of the p-type contact layer 6b is within this range, this is preferable from the viewpoint of light-emitting output.

The LED structure 20, which is provided to the light-emitting element 1 according to the invention, is formed on the surface 3a of the underlying layer 3 in which dislocation is reduced and which has the excellent crystallinity as described above. In the invention, first, the substrate 10 is configured in such a manner that the main surface 11 including the flat surface 12 and the convex portions 13 is provided, the base width $d_1$ of the convex portions 13 is set to 0.05 to 1.5 μm, and the height h is set to 0.05 to 1 μm. In addition, the underlying layer 3 is configured as a layer that is formed on the main surface 11 of the substrate 10 by epitaxially growing the Group III nitride semiconductor so as to cover the flat surface 12 and the convex portions 13. At this time, when the maximum thickness H of the underlying layer 3 is too small, there is a concern that it may enter a state in which the surface of the underlying layer is not sufficiently flattened, but when the maximum thickness H of the underlying layer 3 is set within the above-described range, the underlying layer 3 has a sufficient film thickness with respect to the base width $d_1$ of the convex portions 13. Accordingly, the surface 3a of the underlying layer 3 is satisfactorily flattened, and on the convex portions 13, a crystal defect such as dislocation that remains in an aggregated portion of Group III nitride semiconductor crystals is reduced, and thus the underlying layer 3 having the excellent crystallinity may be obtained. In addition, since the n-type semiconductor layer 4, the light-emitting layer 5, and the p-type semiconductor layer 6, which make up the LED structure 20, are sequentially formed on the surface 3a of the underlying layer 3 described above, occurrence of a crystal defect such as dislocation or lattice mismatch in these respective layers is suppressed, and thus the crystallinity becomes excellent.

Electrode

A light-transmitting positive electrode 9 is formed from a material including at least one kind selected from ITO ($In_2O_3$—$SnO_2$), AZO (ZnO—$Al_2O_3$), IZO ($In_2O_3$—ZnO), and GZO (ZnO—$Ga_2O_3$). As a structure of the light-transmitting positive electrode 9, an arbitrary structure including a structure in the related art may be used without any limitation. In addition, the light-transmitting positive electrode 9 may be formed to cover substantially the entire upper surface of the p-type semiconductor layer 6, or may be formed in a lattice shape or tree shape with a gap.

A positive-electrode bonding pad 7 is formed on a part of the light-transmitting positive electrode 9 including a light-transmitting conductive oxide film layer that comes into contact with the p-type semiconductor layer 6, and is used for electrical connection with a circuit substrate, a lead frame, or the like. Various structures using Au, Al, Ni, Cu, or the like are disclosed in the related art for the positive-electrode bonding pad, and these materials and structures that are known in the related art may be used without any limitation.

A negative-electrode bonding pad 8 is formed to come into contact with the n-type semiconductor layer 4 of the LED structure 20. Accordingly, when forming the negative-electrode bonding pad 8, a part of the light-emitting layer 5 and the p-type semiconductor layer 6 is removed to expose the n-type contact layer of the n-type semiconductor layer 4, and then the negative-electrode bonding pad 8 is formed on the exposed layer.

Various compositions and structures are disclosed in the related art for the negative-electrode bonding pad 8, and these compositions or structures that are known in the related art may be used without any limitation, and the negative-electrode bonding pad 8 may be provided by common means that is well known in this technical field.

According to the Group III nitride semiconductor light-emitting element 1 related to the invention, due to the above-described configuration, the internal quantum efficiency and the light extraction efficiency may be high, and excellent light-emitting properties and external appearance properties may be obtained.

Manufacturing Method and Reticle

Hereinafter, a description will be made with respect to the method for manufacturing the Group III nitride semiconductor light-emitting element of the invention, and a reticle (photomask) that may be used for the manufacturing of the Group III nitride semiconductor light-emitting element referring to FIGS. 1 to 8.

As described above, the method for manufacturing the light-emitting element related to the invention includes a substrate-processing process of periodically forming the plurality of convex portions 13 having the base width $d_1$ and the height h in the flat surface 12, which is formed from a (0001) C-plane, of the substrate 10 formed form sapphire to form the main surface 11 including the flat surface 12 and the convex portions 13 in the substrate 10, an epitaxial process of epitaxially growing the underlying layer 3 on the main surface 11 of the substrate 10 so as to cover the flat surface 12 and the convex portions 13, and an LED lamination process of forming the LED structure 20 by epitaxially growing the Group III nitride semiconductor subsequently to the epitaxial process. Furthermore, in the substrate-processing process, the mask patterns 15 are sequentially formed in the respective regions R1 and R2 of the flat surface 12 using the polygonal reticle (photomask) 51 that has two pairs of parallel opposing ends in a plan view and is configured in a parallelogram shape in a plan view in the example shown in FIG. 6 (also, refer to FIGS. 7 to 9) by the stepper exposure method, and the flat surface 12 is etched. According to this, in the in-plane direction of the flat surface 12 of the substrate 10, the plurality of the convex portions 13 are arranged to be parallel with the two pairs of parallel ends 51a, 51b, 51c, and 51d of the reticle 51, respectively, and to be periodic in two axial directions of one arrangement axis J1 and the other arrangement axis J2 intersecting each other. In addition, in the manufacturing method related to the invention, among the plurality of convex portions 13, three arbitrary convex portions 13, which are adjacent to each other and are arranged in a triangular shape in a plan view, are disposed and formed in an isosceles triangular shape in a plan view.

Hereinafter, each process that is provided to the manufacturing method of the invention will be described in detail.

Substrate-Processing Process

FIG. 2 shows a view explaining an example of a process of manufacturing the laminated structure shown in the schematic view of FIG. 1, and is a perspective view illustrating the substrate 10 that is used in the manufacturing method of this embodiment. The substrate 10 has the main surface 11 including the flat surface 12 formed from the C-plane, and the plurality of convex portions 13 that are formed in the C-plane. In the substrate-processing process of the invention, the main surface 11 that has a concavo-convex shape is formed in the flat surface 12 of the substrate 10 by forming the plurality of convex portions 13 having the base width of 0.05 to 1.5 μm and the height h of 0.05 to 1 μm. In addition, in the substrate-processing process, the plurality of convex portions 13 are arranged to be parallel with the two pairs of parallel ends 51a, 51b, 51c, and 51d of the reticle 51, respectively, and to be periodic in two axial directions of one arrangement axis J1 and the other arrangement axis J2 intersecting each other in the in-plane direction of the flat surface 12 of the substrate 10. In addition, among the plurality of convex portions 13, three arbitrary convex portions 13, which are adjacent to each other and are arranged in a triangular shape in a plan view, are disposed in an isosceles triangular shape in a plan view.

In the substrate-processing process, for example, the main surface 11, which includes the flat surface 12 formed from the C-plane and the convex portions 13, is formed by forming the plurality of convex portions 13 having the surface 13c not parallel with the C-plane in the (0001) C-plane of the sapphire substrate, whereby the substrate is obtained. For example, the substrate-processing process may be carried out by a method including a patterning process of forming the mask patterns 15 that define planar disposition of the convex portions 13 in the substrate 10, and an etching process of forming the convex portions 13 by etching the substrate 10 using the mask patterns 15 formed by the patterning process.

Hereinafter, an example of a method of processing the substrate 10 as shown in FIG. 2 will be described in detail.

In this embodiment, as a substrate material in which the plurality of convex portions 13 are formed, a sapphire single crystal wafer in which the (0001) C-plane is set as a surface is used. Here, the substrate, in which the (0001) C-plane is set as the surface, includes a substrate in which an offset angle within a range of ±3° from the [0001] direction is applied to a plane orientation of the substrate. In addition, the "surface that is not parallel with the C-plane" described in the invention represents a surface that deviates from the (0001) C-plane by an angle larger than ±3°.

The patterning process that is provided to the substrate-processing process may be carried out by general photolithography methods, and in the invention, a stepper exposure method is adopted. Since the base width $d_1$ of the base 13a of the convex portions 13 that are formed in the substrate-processing process is preferably 1.5 μm or less, among the photolithography methods, the stepper exposure method is suitably used to uniformly pattern the entirety of the surface of the substrate 10.

Figure 12:
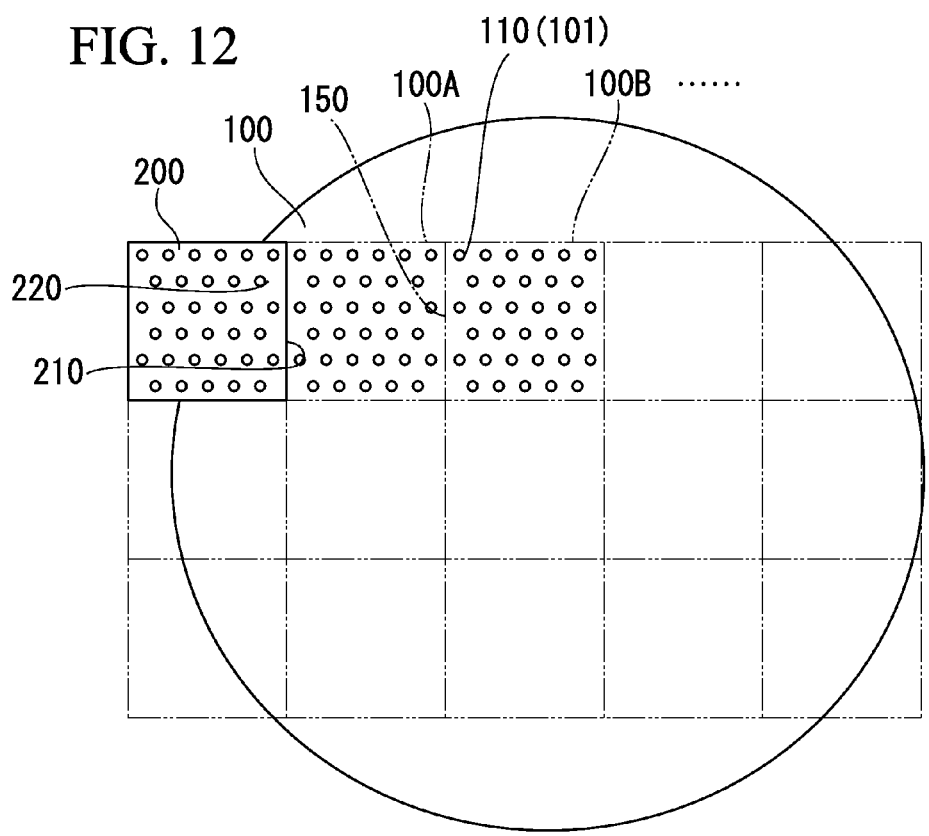
FIG. 12 is a view schematically explaining an example of the method for manufacturing the light-emitting element, the light-emitting element, and a reticle in the related art, and is a plan view illustrating a process of forming a convex portion in the surface of the substrate while sequentially moving the reticle having a square shape in a plan view.

As described above, in the related art, in a case of forming the mask patterns 110 having a triangular dot disposition on a substrate 100 using a reticle 200 having a square shape in a plan view as shown in FIG. 12, there is a possibility that a portion not normally exposed may occur between respective regions 100A and 100B. In this case, since a linear convex portion is formed on the substrate surface, a modified portion having high crystal defect density is formed in the Group III nitride semiconductor layer, and thus a decrease in light-emitting efficiency occurs due to an external appearance defect or a decrease in internal quantum efficiency. In addition, there is a possibility that deformation or deficiency of the dots may occur in a joint line portion of the respective regions 100A and 100B. In this case, there is a concern that the light-emitting efficiency decreases due to a decrease in the internal quantum efficiency that is caused by an increase in dislocation density, and a decrease in light extraction efficiency.

In the manufacturing method of the invention, when forming the fine mask patterns 15 obtained by disposing dots in a triangular disposition using the stepper exposure method, a method using the reticle (photomask) 51 is adopted. The reticle 51 has a polygonal shape that has two pairs of parallel opposing ends in a plan view and is configured in a parallelogram shape in a plan view in the example shown in FIGS. 6 to 9. According to this, a distance between ends of the reticles 51 and dots may be sufficiently secured, and thus the above-described problem may be prevented from occurring in the vicinity of the joint line 16 of the mask patterns 15.

In addition, in this embodiment, in the in-plane direction of the flat surface 12 of the substrate 10, the convex portions 13 are arranged and formed to be parallel with the two pairs of parallel ends 51a, 51b, 51c, and 51d of the reticle 51, respectively, and to be periodic in two axial directions of one arrangement axis J1 and the other arrangement axis J2 intersecting each other. In addition, similarly to the example shown in FIG. 6, among the plurality of convex portions 13, three arbitrary convex portions 13, which are adjacent to each other and are arranged in a triangular shape in a plan view, are disposed and formed in an equilateral triangular shape in a plan view. In this case, as shown in FIG. 6, dots 53, which pattern a positive resist in two axial directions of one arrangement axis J1 and the other arrangement axis J2 parallel with the two pairs of parallel ends 51a, 51b, 51c, and 51d, respectively, are formed in the reticle 51. In addition, in the patterning process, the mask patterns 15 are periodically arranged and formed on the substrate 10 in the two axial directions of the one arrangement axis J1 and the other arrangement axis J2. Then, in the etching process, the flat surface 12 of the substrate 10 is etched using the mask patterns 15, whereby the convex portions 13, in which the distance $d_2$ is set within an appropriate range, are formed on the flat surface 12.

The convex portions 13 having the surface 13c not parallel with the C-plane may be formed by dry-etching the substrate 10 until the mask patterns 15, which are formed by the above-described patterning process, are eliminated. More specifically, for example, a resist is formed on the substrate 10, the resist is patterned to have a predetermined shape, and each side surface of the resist is made into a tapered shape by post-baking in which a heat treatment is performed using an oven or the like at a temperature of 110° C. for 30 minutes. Subsequently, dry-etching is performed under predetermined conditions for promoting etching in a lateral direction until the resist is eliminated, whereby the convex portions 13 may be formed.

In addition, the convex portions 13 having the surface 13c not parallel with the C-plane may be formed by a method in which the dry-etching is stopped before the mask patterns 15 disappear, the mask patterns 15 are peeled off, and the substrate 10 is dry-etched again. More specifically, for example, the resist is formed on the substrate 10, the resist is patterned to have a predetermined shape, and each side surface of the resist is made into a tapered shape by post-baking in which a heat treatment is performed using an oven or the like at a temperature of 110° C. for 30 minutes. Subsequently, the dry-etching is performed under predetermined conditions for promoting etching in a lateral direction, and the dry-etching is stopped before the resist is eliminated. Then, the resist is peeled off, and the dry-etching is performed again to perform the etching in a predetermined amount, whereby the convex portions 13 may be formed. The convex portions 13 formed by this method have excellent in-plane uniformity of height dimensions.

In addition, in a case of using a wet-etching method as the etching method, the convex portions 13 having the surface 13c not parallel with the C-plane may be formed in combination with the dry-etching method. For example, in a case where the substrate is formed from a sapphire single crystal, the substrate may be wet-etched by using a mixed acid of phosphoric acid and sulfuric acid, which is set to a high temperature of 250° C.

Figure 7:
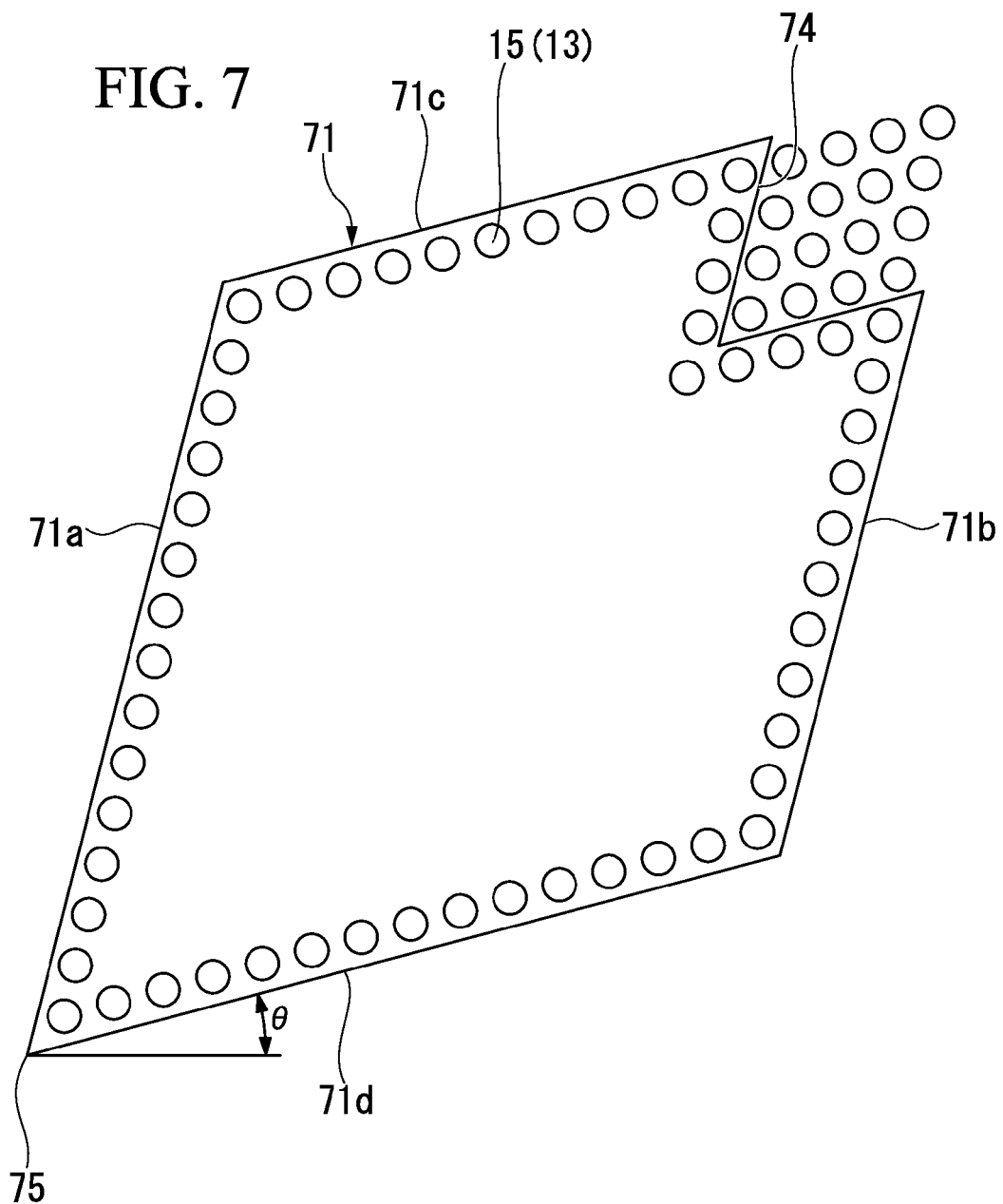
FIG. 7 is a view schematically explaining another example of the method for manufacturing the Group III nitride semiconductor light-emitting element, the Group III nitride semiconductor light-emitting element, and the reticle that are related to the invention, and is a plan view illustrating an example of forming the plurality of convex portions in the surface of the substrate while sequentially moving a reticle, which has a cut-out portion at one corner portion, in a state in which the reticle is inclined with respect to a crystal orientation of the substrate in a planar direction of the substrate.

In addition, it is preferable to carry out the substrate-processing process of the invention by a method in which the mask patterns are formed on the flat surface 12 of the substrate 10 while sequentially moving a reticle 71 in a state in which one side of the reticle 71 is inclined with respect to the crystal orientation of the substrate 10 shown in FIG. 6 at an angle of 5 to 25° in a planar direction of the substrate 10, similarly to the reticle 71 that is illustrated in FIG. 7. That is, the reticle 71 is sequentially moved in a state in which ends 71c and 71d of the reticle 71 shown in FIG. 7 are inclined with respect to a cleavage direction of the sapphire substrate 10 shown in FIG. 6, that is, an orientation flat 14 that is formed in the substrate 10 at an angle within the above-described range and 15° in the example that is shown in the drawing.

Generally, a linear orientation flat of which a position is determined according to a crystal orientation is formed in a sapphire substrate. In this embodiment, similarly to the reticle 71 shown in FIG. 7, the ends 71c and 71d are inclined with respect to the orientation flat 14 of the substrate 10 shown in FIG. 6 at a predetermined angle, and in this state, the reticle 71 is sequentially moved in such a manner that a position of a cut-out portion 74 of the reticle 71 and a position of a corner portion 75 of the reticle 71 after movement overlap each other, and exposure is performed. At this time, a portion that is subjected to double exposure occurs due to the inclination of the reticle, but the cut-out portion 74 is provided to avoid the double exposure.

Hereinafter, a description will be made with respect to a preferred range of the inclination angle $\theta$ in a case in which the reticle is sequentially moved in a state in which one side of the reticle is inclined with respect to the crystal orientation of the substrate referring to partial views of FIGS. 8A to 8D. Here, a reticle, in which dots (mask patterns 15) configured to form the convex portions on the substrate are arranged in an equilateral triangular shape, will be described as an example.

Figure 8A:
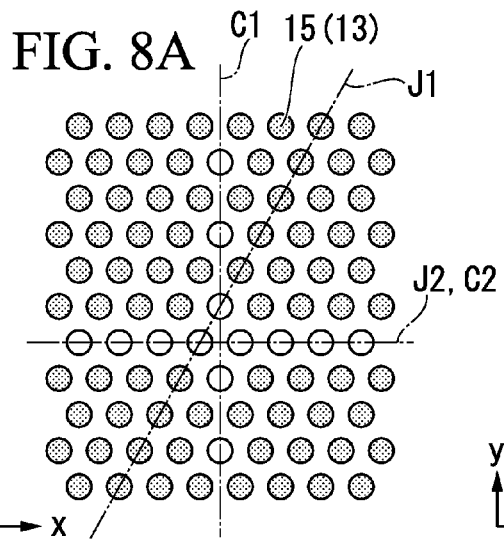
FIG. 8A is a view schematically explaining still another example of the method for manufacturing the Group III nitride semiconductor light-emitting element, the Group III nitride semiconductor light-emitting element, and the reticle that are related to the invention, and is a partial plan view illustrating an inclination angle θ in a case of inclining a polygonal reticle, in which two opposing sides are parallel with each other in a plan view, with respect to the crystal orientation of the substrate in the planar direction of the substrate.

As shown in FIG. 8A, in a case in which one side of the reticle is disposed at 0° with respect to the orientation flat (refer to the reference number 14 shown in FIG. 6), that is, the disposition is made similarly to the related art without inclination, the number of dots through which a cutting line passes during the chipping is greatly different between an x-direction and a y-direction. In a partial view of an example shown in FIG. 8A, a cutting line C2 passes through eight dots, but a cutting line C1 passes through five dots. In this way, when the number of the dots through which the cutting line C1 and the number of the dots through which the cutting line C2 are greatly different in the x-direction and the y-direction, a variation in light extraction efficiency occurs between tips (light-emitting elements) that are cut, and thus there is a concern that a difference in brightness increases. In addition, in a case where the position of the cutting line C2 deviates toward an upper side or a lower side by a half of the diameter of the dot compared to the example shown in FIG. 8A, the cutting line C2 does not pass through the dots. Therefore, numerous places at which the light-emitting properties deteriorate may be present depending on a chip-cutting position of the wafer. As a result, there is a problem in that a yield ratio decreases.

Figure 8B:
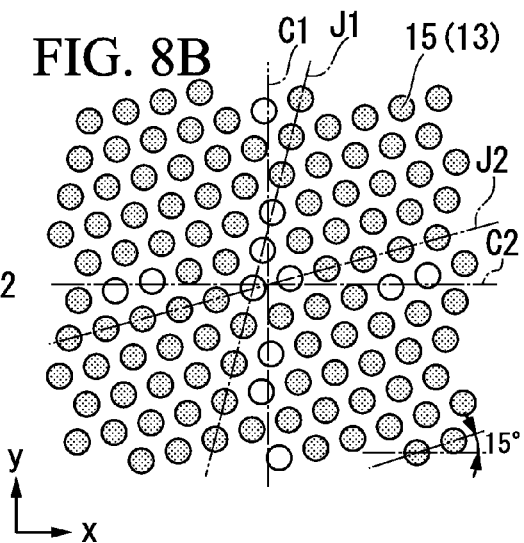
FIG. 8B is a view schematically explaining still another example of the method for manufacturing the Group III nitride semiconductor light-emitting element, the Group III nitride semiconductor light-emitting element, and the reticle that are related to the invention, and is a partial plan view illustrating the inclination angle θ in the case of inclining the polygonal reticle, in which two opposing sides are parallel with each other in a plan view, with respect to the crystal orientation of the substrate in the planar direction of the substrate.

Conversely, as shown in FIG. 8B, one side of the reticle is disposed to be inclined (rotation in the counterclockwise direction) with respect to the orientation flat 14 formed in the substrate 10 shown in FIG. 6, for example, at an angle of +15°, and it can be seen that arrangement of the dots (mask patterns 15) is approximately equivalent in each of the x-direction and the y-direction. That is, in FIG. 8B, it can be seen that both a horizontal line (the cutting line C2) and a vertical line (the cutting line C1) in the x-direction and the y-direction with respect to arbitrary dots (mask patterns 15) pass through six dots, respectively. That is, according to this embodiment, when the Group III nitride semiconductor is laminated on the substrate 10 and the resultant structure is chipped, the number of the dots through which the cutting line C1 or C2 passes, that is, the number of the convex portions 13 becomes the same in each of the x-direction and the y-direction. Accordingly, a difference in brightness between chips (light-emitting elements) is not likely to occur. In addition, even when the cutting line C2 vertically deviates, the number of dots through which the cutting line C2 passes does not largely vary. According to this, in the invention, it is possible to obtain an effect in which excellent light-emitting properties are obtained, and at the same time, a yield ratio is improved.

Figure 8C:
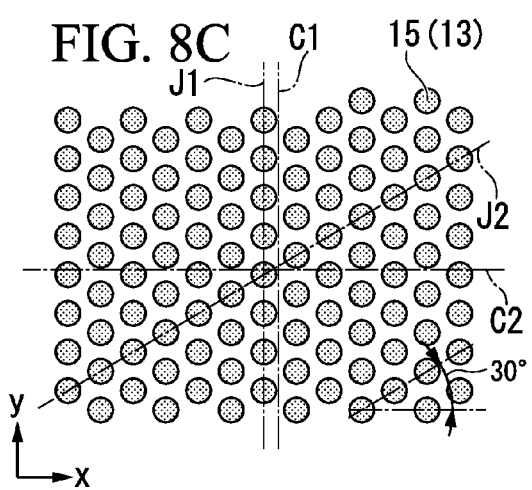
FIG. 8C is a view schematically explaining still another example of the method for manufacturing the Group III nitride semiconductor light-emitting element, the Group III nitride semiconductor light-emitting element, and the reticle that are related to the invention, and is a partial plan view illustrating the inclination angle θ in the case of inclining the polygonal reticle, in which two opposing sides are parallel with each other in a plan view, with respect to the crystal orientation of the substrate in the planar direction of the substrate.

On the other hand, as shown in FIG. 8C, one side of the reticle is disposed to be inclined (counterclockwise direction: equivalent to rotation by 90°) with respect to the orientation flat (refer to the reference number 14 shown in FIG. 6), for example, at an angle of +30°, the number of dots through which the cutting line passes during the chipping is largely different in each of the x-direction and the y-direction. Specifically, within a range shown in FIG. 8C, the number of the dots through which the cutting line C2 passes in the x-direction is seven, but all dots deviate from the cutting line C1 in the y-direction. In this way, when the number of dots through which the cutting line C1 or C2, that is, the number of the convex portions 13 that are formed in each chip during the chipping is largely different in each of the x-direction and the y-direction, a variation in the light extraction efficiency between chips occurs, and there is a concern that a difference in brightness increases. Therefore, similarly to the case of FIG. 8A, places at which the light-emitting properties deteriorate may be present depending on a chip-cutting position of the wafer. As a result, there is a problem in that a yield ratio decreases.

Figure 8D:
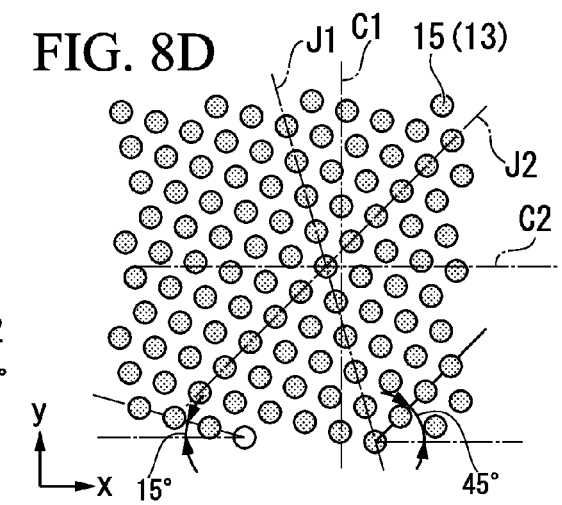
FIG. 8D is a view schematically explaining still another example of the method for manufacturing the Group III nitride semiconductor light-emitting element, the Group III nitride semiconductor light-emitting element, and the reticle that are related to the invention, and is a partial plan view illustrating the inclination angle θ in the case of inclining the polygonal reticle, in which two opposing sides are parallel with each other in a plan view, with respect to the crystal orientation of the substrate in the planar direction of the substrate.

Furthermore, as shown in FIG. 8D, in a case of disposing one side of the reticle to be inclined (counterclockwise direction) with respect to the orientation flat at an angle of +45°, this becomes equivalent (mirror image relationship) to rotation by 15° in the clockwise direction (−15°). In this case, similarly to the example shown in FIG. 8B, it is possible to obtain an effect in which excellent light-emitting properties are obtained, and at the same time, a yield ratio is improved.

Figure 8E:
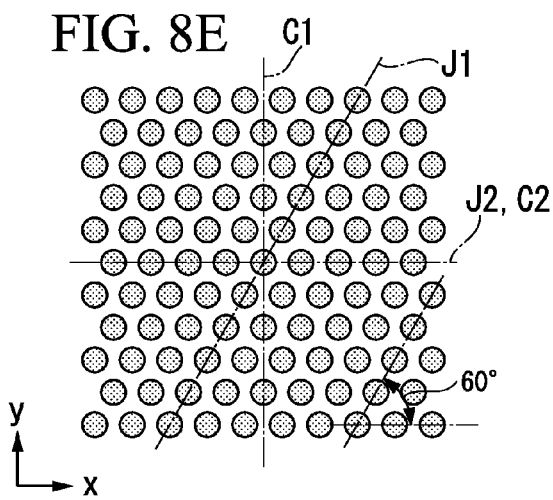
FIG. 8E is a view schematically explaining still another example of the method for manufacturing the Group III nitride semiconductor light-emitting element, the Group III nitride semiconductor light-emitting element, and the reticle that are related to the invention, and is a partial plan view illustrating the inclination angle θ in the case of inclining the polygonal reticle, in which two opposing sides are parallel with each other in a plan view, with respect to the crystal orientation of the substrate in the planar direction of the substrate.

In addition, as shown in FIG. 8E, in a case of disposing one side of the reticle to be inclined (counterclockwise direction) with respect to the orientation flat at an angle of +60°, this becomes equivalent to the case in which an inclination angle is 0°. In this case, similarly to the example shown in FIG. 8A, places at which the light-emitting properties deteriorate may be present depending on a chip-cutting position of the wafer. As a result, there is a problem in that a yield ratio decreases.

As a result, in this invention, in the case of adapting the method in which the mask patterns are formed on the substrate while sequentially moving the reticle in a state in which one side of the reticle is inclined with respect to the crystal orientation of the substrate, it is preferable that the inclination angle θ be set within a range of 5 to 250, and more preferably approximately 15°.

Reticle

The reticle related to the invention is used to transfer the mask patterns configured to form the convex portions in the flat surface of the substrate in the above-described substrate-processing process when manufacturing the Group III nitride semiconductor light-emitting element. In addition, when describing the reticle of the invention, detailed description with respect to matters which are common to the description of the above-described substrate-processing process will be omitted.

That is, as shown in FIG. 6, the reticle 51 related to the invention is used to form the mask patterns 15 configured to form the plurality of convex portions 13 in the flat surface 12 of the substrate 10 by performing the transferring onto the flat surface 12 of the substrate 10 formed from sapphire according to the stepper exposure method. In addition, the reticle 51 has a parallelogram shape in a plan view, and the transfer patterns, which are configured to form the plurality of convex portions 13 in the flat surface 12 of the substrate 10, are arranged to be parallel with the two pairs of parallel ends 51a, 51b, 51c, and 51d of the reticle 51, respectively, and to be periodic in two axial directions of one arrangement axis J1 and the other arrangement axis J2 intersecting each other. Furthermore, the reticle 51 is formed in a pattern to dispose three arbitrary convex portions 13, which are adjacent to each other and are arranged in a triangular shape in a plan view, among the plurality of convex portions 13 formed in the flat surface 12 of the substrate 10 in an isosceles triangular shape in a plan view, and more specifically in an equilateral triangular shape in a plan view.

In addition, the reticle related to the invention is not limited to the example shown in FIG. 6. For example, as shown in FIG. 7, the reticle may have a configuration in which the cut-out portion 74 is formed on at least one arbitrary corner portion among four corner portions similarly to the above-described reticle 71.

Figure 9A:
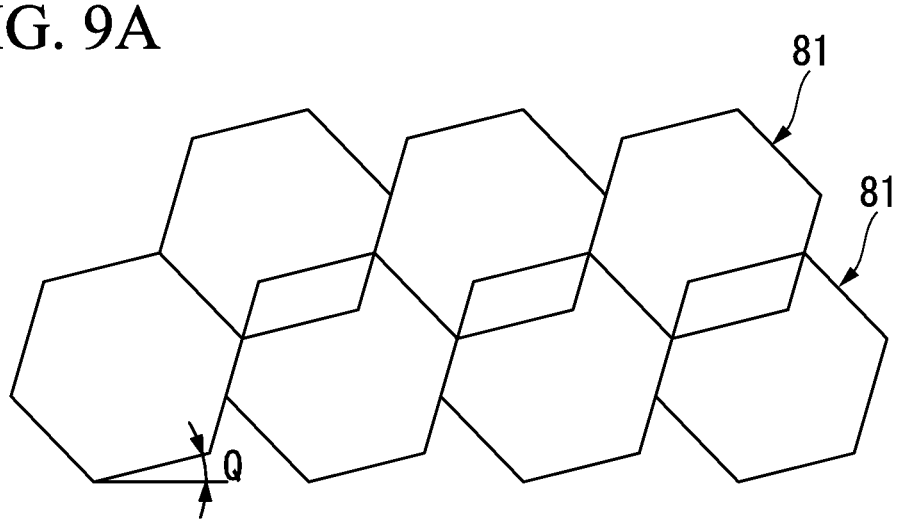
FIG. 9A is a view schematically explaining still another example of the method for manufacturing the Group III nitride semiconductor light-emitting element, the Group III nitride semiconductor light-emitting element, and the reticle that are related to the invention, and is a plan view illustrating the inclination angle θ in a case of inclining a reticle, which has a hexagonal shape in a plan view, with respect to the crystal orientation of the substrate in the planar direction of the substrate.
Figure 9B:
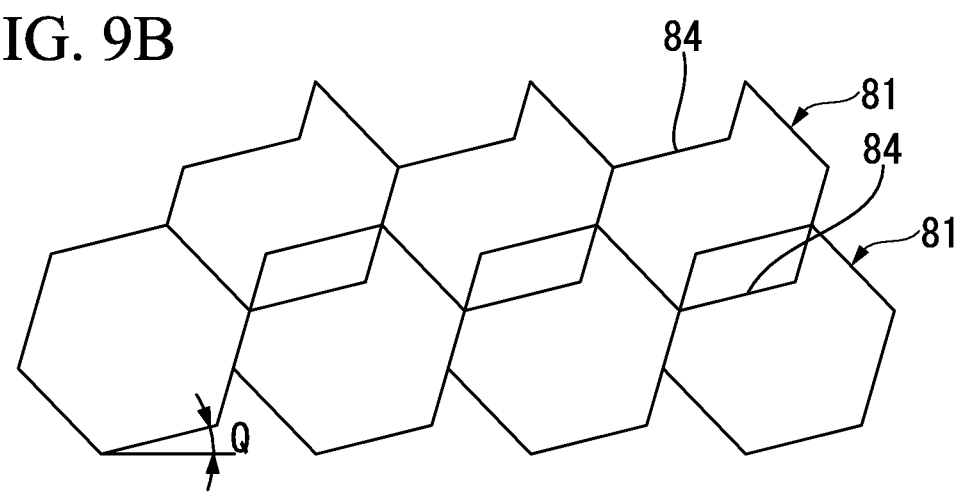
FIG. 9B is a view schematically explaining still another example of the method for manufacturing the Group III nitride semiconductor light-emitting element, the Group III nitride semiconductor light-emitting element, and the reticle that are related to the invention, and is a plan view illustrating the inclination angle θ in the case of inclining the reticle, which has the hexagonal shape in a plan view, with respect to the crystal orientation of the substrate in the planar direction of the substrate.

Furthermore, similarly to examples shown in FIGS. 9A and 9B, the reticle related to the invention may be configured in a hexagonal shape in a plan view. In the examples shown in FIGS. 9A and 9B, the reticle is disposed to be inclined with respect to the orientation flat 14 formed in the substrate 10 as shown in FIG. 6 in an angle of 15°. Furthermore, in the example shown in FIG. 9B, similarly to the reticle 71 having a parallelogram shape in a plan view as shown in FIG. 7, a cut-out portions 84 is formed at arbitrary one corner portion among six corner portions. In this embodiment, the above-described effect may be obtained by performing the transferring onto the flat surface 12 of the substrate 10 formed from sapphire by using this reticle 81 according to the stepper exposure method.

Buffer Layer-Forming Process

In this embodiment, a buffer layer-forming process is provided of laminating the buffer layer 2 as shown in FIG. 1 (also refer to FIG. 3) on the main surface 11 of the substrate 10 that is prepared according to the above-described method. In the example described in this embodiment, the buffer layer 2 as shown in FIG. 1 is laminated on the main surface 11 of the substrate 10 by performing the buffer layer-forming process after the substrate-processing process and before an epitaxial process.

Pre-Treatment of Substrate

In this embodiment, it is preferable to perform the pre-treatment using a reverse sputtering method or the like by plasma treatment after introducing the substrate 10 into a chamber of a sputtering apparatus and before forming the buffer layer 2. Specifically, a surface of the substrate 10 may be finished by exposing the substrate 10 in Ar or $N_2$ plasma. For example, organic materials or oxides attached to the surface of the substrate 10 may be removed by reverse sputtering in which plasma of Ar gas, $N_2$ gas, or the like is caused to operate on the surface of the substrate 10. In this case, since a voltage is applied between the substrate 10 and the chamber, plasma particles effectively act on the substrate 10. When this pre-treatment is performed with respect to the substrate 10, the buffer layer 2 may be formed on the entirety of the surface of the substrate 10, and thus the crystallinity of a film that is formed on the buffer layer 2 and is formed from a Group III nitride semiconductor may be increased. In addition, it is preferable to perform wet-type pre-treatment to the substrate 10 before performing the above-described pre-treatment by the reverse sputtering.

Formation of Buffer Layer

After performing the pre-treatment with respect to the substrate 10, the buffer layer 2 having a composition of $Al_xGa_{1-x}N$ (1≤x≤0) is formed on the substrate 10 by a reactive sputtering method. In the case of forming the buffer layer 2 having a single crystal structure according to the reactive sputtering method, it is preferable to control a nitrogen raw material in the chamber of the sputtering apparatus and a ratio of a flow rate of nitrogen with respect to a flow rate of an inert gas in such a manner that the nitrogen raw material is within a range of 50% to 100%, and more preferably approximately 75%.

In addition, in the case of forming the buffer layer 2 having a columnar crystal (polycrystal) structure, it is preferable to control the nitrogen raw material in the chamber of the sputtering apparatus and the ratio of the flow rate of the nitrogen with respect to the flow rate of the inert gas in such a manner that the nitrogen raw material is within a range equal to or more than 1% and less than 50%, and more preferably approximately 25%.

Epitaxial Process and LED Lamination Process

Next, in an epitaxial process after the buffer layer-forming process, as shown in FIG. 1 (also, refer to FIG. 3), a single crystalline Group III nitride semiconductor is epitaxially grown on the buffer layer 2 formed on the main surface 11 of the substrate 10 to form the underlying layer (Group III nitride semiconductor layer) 3 so as to cover the main surface 11.

In addition, in the invention, after forming the underlying layer 3 formed from the Group III nitride semiconductor in the epitaxial process, the LED structure 20, which includes respective layers of the n-type semiconductor layer 4, the light-emitting layer 5, and the p-type semiconductor layer 6, is formed on the underlying layer 3 in the LED lamination process.

In addition, in the description of this embodiment, description with respect to a part of configurations which are common to both of the epitaxial process and the LED lamination process of forming the layers using the Group III nitride semiconductor respectively may be omitted.

In the invention, when forming the underlying layer 3, the n-type semiconductor layer 4, the light-emitting layer 5, and the p-type semiconductor layer 6, a method for growing a gallium nitride-based compound semiconductor (Group III nitride semiconductor) is not particularly limited, and all kinds of known methods of growing the nitride semiconductor such as a reactive sputtering method, an MOCVD (metalorganic chemical vapor deposition) method, an HVPE (hybrid vapor phase epitaxy) method, and an MBE (molecular beam epitaxy) method may be applicable.

In this embodiment, a description will be made with respect to an example using the MOCVD method in the epitaxial process and the LED lamination process.

Epitaxial Process (Formation of Underlying Layer: Group III Nitride Semiconductor Layer)

In the epitaxial process, as shown in FIG. 1, the underlying layer 3 is formed on the buffer layer 2 formed on the substrate 10 using the MOCVD method so as to cover the flat surface 12 and the convex portions 13 that make up the main surface 11 of the substrate 10.

In addition, for example, when growing the single crystalline Group III nitride semiconductor on the main surface of the sapphire substrate using the MOCVD method, there are characteristics in that a single crystal is epitaxially grown from the C-plane, but the crystal is not epitaxially grown on the main surface other than the C-Plane. That is, in the example described in this embodiment, when epitaxially growing the underlying layer 3 formed from the single crystalline Group III nitride semiconductor on the main surface 11 of the substrate 10 on which the buffer layer 2 is formed, the crystal is not grown from the convex portions 13 including the surface 13c not parallel to the C-plane, but the crystal, which is oriented in a C-axis direction, is epitaxially grown only from the flat surface 12 formed from the C-plane. According to this, the underlying layer 3 that is formed on the main surface 11 of the substrate 10 is epitaxially grown on the main surface 11 in a lateral direction so as to cover the convex portions 13, and thus a crystal defect such as dislocation does not occur in the crystal. As a result, a layer of which the crystallinity is satisfactorily controlled is obtained.

In the case of epitaxially growing the underlying layer 3 on the main surface 11 side, in which the convex portions 13 are formed, of the substrate 10 by the MOCVD method, it is preferable that a growth pressure and a growth temperature be controlled under conditions to be described below. In general, when the growth pressure is set to be low and the growth temperature is set to be high, crystal growth in the lateral direction is promoted, and when the growth pressure is set to be high and the growth temperature is set to be low, it enters a facet growth mode (triangular cross-sectional shape). In addition, when the growth pressure of an initial period of growth is set to be high, a half-value width (XRC-FWHM) of an X-ray rocking curve decreases, and thus there is a tendency for the crystallinity to be improved.

According to the above-described reasons, in the case of epitaxially growing the underlying layer 3 on the main surface 11, in which the convex portions 13 are formed, of the substrate 10 using the MOCVD method, for example, it is preferable that the growth pressure be made to vary in two stages including a stage until the maximum film thickness H of the underlying layer 3 becomes approximately 2 μm (the first half film formation) and a stage until the maximum film thickness H of the underlying layer 3 becomes approximately 4.5 μm (the second half film formation).

In addition, in the first half film formation, it is preferable that the growth pressure be set to 40 kPa or more, and more preferably approximately 60 kPa.

In addition, in the second half film formation, it is preferable that the growth pressure be set to be less than 40 kPa, and more preferably approximately 20 kPa.

It is preferable that a temperature of the substrate 10 during formation of the underlying layer 3, that is, the growth temperature of the underlying layer 3 be set to 800° C. or higher. This is because when the temperature of the substrate 10 is set to be high during formation of the underlying layer 3, migration of atoms easily occurs, and looping of dislocation easily proceeds. In addition, it is more preferable that the temperature of the substrate 10 during formation of the underlying layer 3 be 900° C. or higher, and still more preferably 1,000° C. or higher. In addition, it is necessary for the temperature of the substrate 10 during formation of the underlying layer 3 to be lower than a temperature at which a crystal is decomposed, and thus it is preferable that the temperature be less than 1,200° C. When the temperature of the substrate 10 during formation of the underlying layer 3 is within the above-described temperature range, the underlying layer 3 having satisfactory crystallinity may be obtained.

When the epitaxial process as described above is performed, a laminated structure shown in FIG. 1 may be obtained.

LED Lamination Process

Subsequently to the epitaxial process, in the LED lamination process, the LED structure 20, which includes respective layers of the n-type semiconductor layer 4, the light-emitting layer 5, and the p-type semiconductor layer 6 as shown in FIG. 3, is laminated on the underlying layer 3 using the MOCVD method.

Formation of n-Type Semiconductor Layer

The n-type semiconductor layer 4 is formed by sequentially laminating the n-type contact layer 4a and the n-type clad layer 4b on the underlying layer 3, which is formed in the epitaxial process, using the MOCVD method.

Formation of Light-Emitting Layer

Subsequently, the light-emitting layer 5 is formed on the n-type clad layer 4b by the MOCVD method. As shown in FIG. 4, the light-emitting layer 5, which is formed in this embodiment, has a laminated structure that starts from a GaN barrier layer and terminates with a GaN barrier layer from the n-type clad layer 4b side. The light-emitting layer 5 is formed by alternately laminating seven layers of the barrier layer 5a formed from GaN, and six layers of the well layer 5b formed from non-doped GaInN.

Formation of p-Type Semiconductor Layer

Subsequently, the p-type clad layer 6a formed from Mg-doped AlGaN and the p-type contact layer 6b are laminated on the light-emitting layer 5, that is, the barrier layer 5a that is the uppermost layer of the light-emitting layer 5 to form the p-type semiconductor layer 6.

Formation of Electrode

Subsequently, as shown in FIG. 3, with respect to the wafer in which the LED structure 20 is formed in the LED lamination process, the light-transmitting positive electrode 9 is formed on the p-type semiconductor layer 6 at a predetermined position, and then the positive-electrode bonding pad 7 is formed on each light-transmitting positive electrode 9. In addition, a predetermined position of the LED structure 20 is etched and removed to expose a part of the n-type semiconductor layer 4, whereby an exposed region 4c is formed. The negative-electrode bonding pad 8 is formed in the exposed region 4c.

Here, as shown in FIG. 5, in the light-emitting element 1 that may be obtained according to the manufacturing method related to the invention, since a modified portion is not present in the respective layers, which are laminated on the substrate 10 and are formed from the Group III nitride semiconductor, on the light-transmitting positive electrode 7 side that is a light extraction surface, abnormality on an external appearance aspect does not occur. According to the manufacturing method related to the invention, the light-emitting element 1, which has excellent light-emitting properties and external appearance properties, may be manufactured by the above-described method.

As described above, according to the method for manufacturing the Group III nitride semiconductor light-emitting element of this embodiment, the method including the substrate-processing process of forming the main surface 11 including the flat surface 12 and the convex portions 13 in the substrate 10 is adapted. In the substrate-processing process, the mask patterns 15 are sequentially formed in the respective regions R1 and R2 of the flat surface 12, which is formed from the (0001) C-plane, of the substrate 10 using the polygonal reticle 51 having two pairs of parallel ends in a plan view (a parallelogram shape in the example shown in FIG. 6) by the stepper exposure method. Then, the flat surface 12 is etched, and thus the plurality of convex portions 13 having the base width $d_1$ and the height h are disposed to be parallel with the two pairs of parallel ends 51a, 51b, 51c, and 51d of the reticle 51, respectively, and to be periodic in two axial directions of one arrangement axis J1 and the other arrangement axis J2 intersecting each other in the in-plane direction of the flat surface 12 of the substrate 10. In addition, among the plurality of convex portions 13 formed in the flat surface 12 of the substrate 10, three arbitrary convex portions 13, which are adjacent to each other and are arranged in a triangular shape in a plan view, are disposed in an isosceles triangular shape (an equilateral triangular shape in the example shown in FIG. 6) in a plan view. According to this, with regard to the joint line 16, a linear convex portion may be prevented from being generated in the substrate 10. Accordingly, occurrence of a modified portion in each layer, which is formed on the main surface 11 of the substrate 10, may be suppressed, and thus external appearance properties of the light-emitting element 1 are improved, and occurrence of dislocation in each layer of the LED structure that is formed on the underlying layer 3 is suppressed. Accordingly, the crystallinity is improved, and thus the internal quantum efficiency is improved. In addition, deformation or deficiency of the convex portion 13 may be prevented, and thus the internal quantum efficiency and the light extraction efficiency are improved. As a result, the light-emitting element 1, in which the internal quantum efficiency and the light extraction efficiency are high, and which has excellent light-emitting properties and external appearance properties, may be manufactured with high productivity.

In addition, according to the reticle 51 related to the invention, the external shape thereof is set to a polygonal shape having two pairs of parallel opposing ends in a plan view (a parallelogram shape in the example shown in FIG. 6), and the transfer patterns, which are configured to periodically arrange and form the plurality of convex portions 13 in the flat surface 12 of the substrate 10, are arranged to be parallel with the two pairs of parallel ends 51a, 51b, 51c, and 51d of the reticle 51, respectively, and to be periodic in two axial directions of one arrangement axis J1 and the other arrangement axis J2 intersecting each other. Furthermore, the reticle 51 related to the invention adapts a pattern configuration to dispose three arbitrary convex portions 13, which are adjacent to each other and are arranged in a triangular shape (an equilateral triangular shape in the example shown in FIG. 6) in a plan view, among the plurality of convex portions 13 formed in the flat surface 12 of the substrate 10 in an isosceles triangular shape in a plan view. When the main surface 11 including the flat surface 12 and the convex portions 13 is formed in the substrate 10 using this reticle 51, and the Group III nitride semiconductor is epitaxially grown to cover the main surface 11, thereby manufacturing the Group III nitride semiconductor light-emitting element 1, the light-emitting element 1 in which the internal quantum efficiency and the light extraction efficiency are high, and which has excellent light-emitting properties and the external appearance properties as described above, may be manufactured.

Lamp

Figure 10:
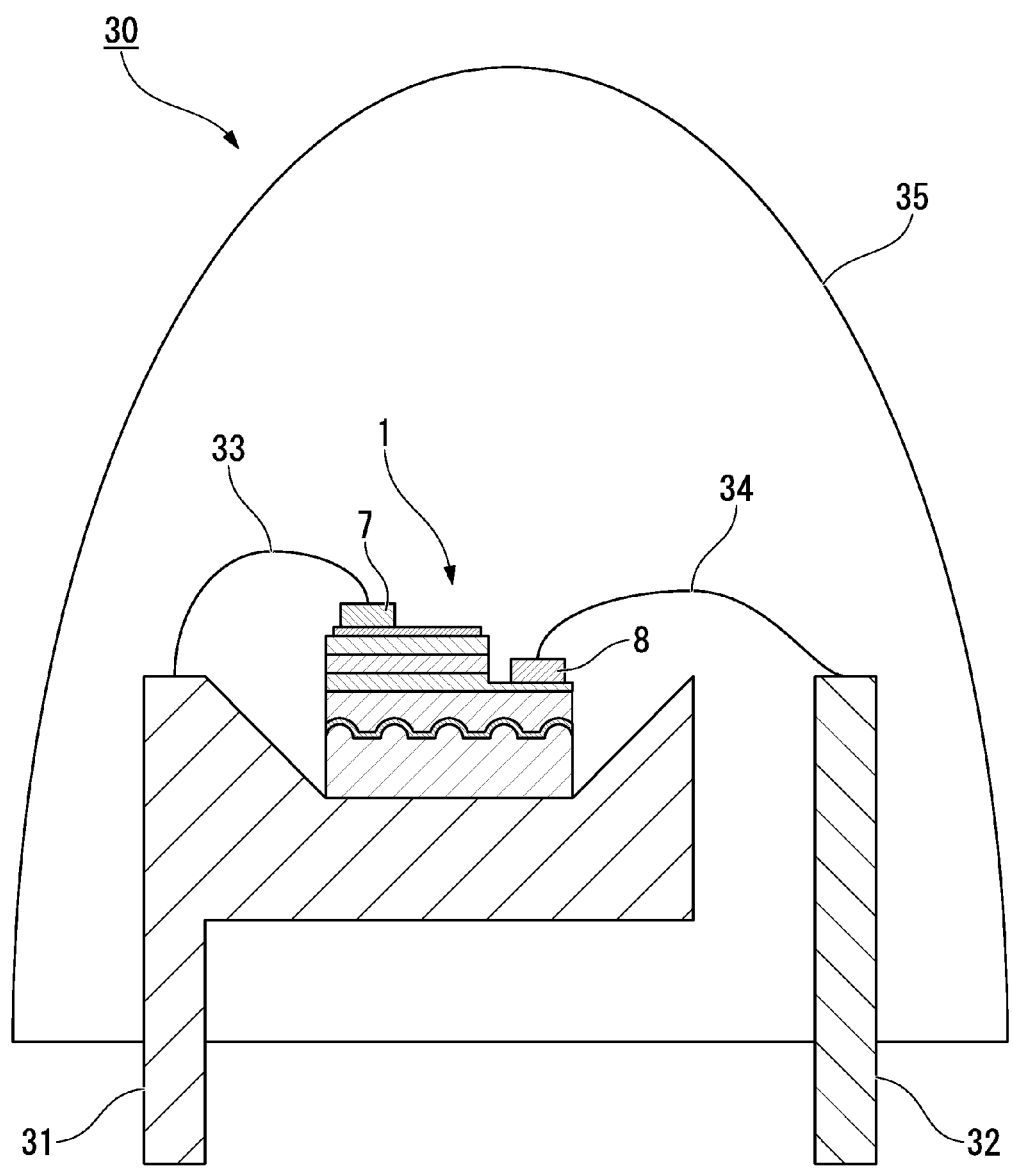
FIG. 10 is a schematic view schematically illustrating an example of a lamp that is constructed using the Group III nitride semiconductor light-emitting element related to the invention.
Figure 11:
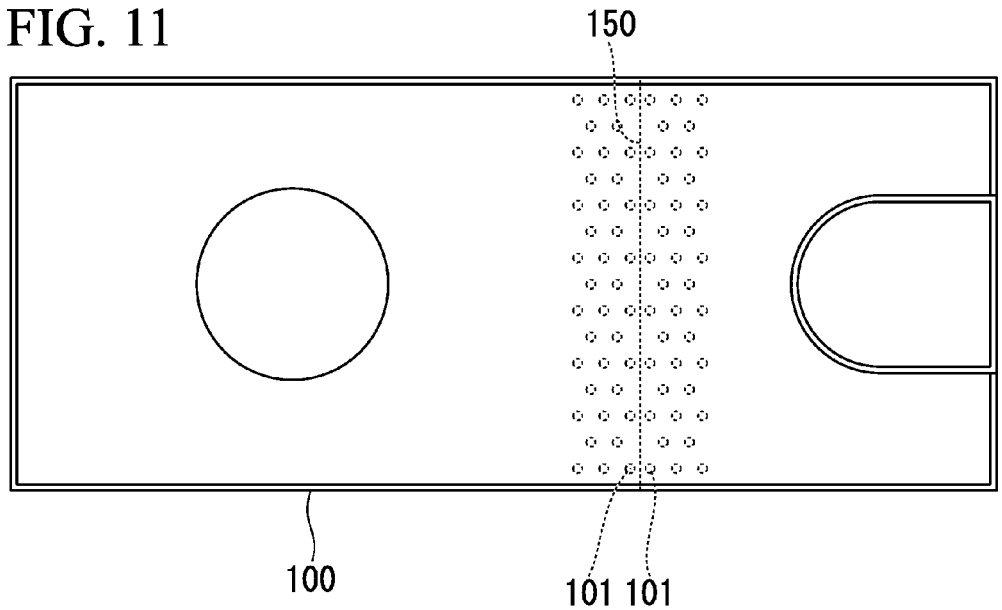
FIG. 11 is a view schematically explaining an example of a method for manufacturing a light-emitting element, and a light-emitting element in the related art, and is a schematic plan view illustrating a surface state of a substrate.

FIG. 10 shows a schematic view schematically illustrating an example of a lamp that is configured by using the Group III nitride semiconductor light-emitting element related to the invention. A lamp 30 shown in FIG. 10 is a cannonball-type lamp, and the Group III nitride semiconductor light-emitting element 1 shown in FIG. 3 is used. As shown in FIG. 10, the positive-electrode bonding pad 7 of the Group III nitride semiconductor light-emitting element 1 is joined to one of two frames 31 and 32 (the frame 31 in FIG. 10) with a wire 33, and the negative-electrode bonding pad 8 of the light-emitting element 1 is joined to the other frame 32 with a wire 34, whereby the Group III nitride semiconductor light-emitting element 1 is mounted. In addition, the periphery of the Group III nitride semiconductor light-emitting element 1 is sealed with a mold 35 formed from a transparent resin. In addition, when a fluorescent substance is added to the resin constructing the mold 35, white light may be emitted.

Since the Group III nitride semiconductor light-emitting element 1 of the invention is used, the lamp of the invention has excellent light-emitting properties.

EXAMPLES

Next, the method for manufacturing the Group III nitride semiconductor light-emitting element, the Group III nitride semiconductor light-emitting element, the lamp, and the reticle related to the invention will be described in more detail referring to examples and comparative examples, but the invention is not limited to these examples.

Example 1

First, a plurality of convex portions, which were set to conditions shown in Table 1 to be described below, were formed in the (0001) C-plane of a sapphire substrate in the following sequences, whereby a substrate having a main surface including a flat surface and convex portions was prepared (substrate-processing process). That is, a mask was formed on the C-plane sapphire substrate having the diameter of four inches by a photolithography method, and the sapphire substrate was etched by a dry etching method, whereby the convex portions were formed in the sapphire substrate.

In addition, in the substrate-processing process, a stepper exposure method using ultraviolet light was used as an exposure method during formation of the mask pattern on the substrate. In addition, as a reticle (photomask) provided to a stepper exposure apparatus, a reticle was used which was set to a parallelogram shape in a plan view, and in which dots configured to pattern a held resist were provided to be parallel with two pairs of parallel ends, respectively, and to be periodic in one arrangement axis and the other arrangement axis intersecting each other (refer to the reticle 51 shown in FIG. 6).

In addition, mask patterns were formed on the substrate to be periodic in two axial directions of one arrangement axis and the other arrangement axis. Then, the flat surface of the substrate was etched using the mask patterns, whereby the convex portions were formed in the flat surface.

In addition, when the surface of the substrate was dry-etched, a mixed gas of $BCl_3$ and $Cl_2$ was used.

TABLE 1

| | Convex portion of substrate | | | | Reticle used | | Angle θ with respect to orientation flat (°) | X-ray diffraction (XRD) of underlying layer | | Notes |
|---|---|---|---|---|---|---|---|---|---|---|
| | Base width (μm) | Height (μm) | Base width/4 (μm) | Distance between adjacent convex portions (μm) | Shape in a plan view | Dot arrangement | | (0002) Plane (arcsec) | (10-10) Plane (arcsec) | |
| Example 1 | 1.0 | 1.0 | 0.25 | 1.8 | Parallelogram shape (FIG. 6) | Parallel end arrangement (Arrangement in equilateral triangular shape) | 0 | 36 | 172 | |
| Example 2 | 1.0 | 1.0 | 0.25 | 1.8 | Parallelogram shape (FIG. 7) | Parallel end arrangement (Arrangement in equilateral triangular shape) | 15 | 31 | 165 | |
| Example 3 | 1.0 | 1.0 | 0.25 | 1.8 | Parallelogram shape (FIG. 7) | Parallel end arrangement (Arrangement in equilateral triangular shape) | 5 | 33 | 170 | |
| Example 4 | 1.0 | 1.0 | 0.25 | 1.8 | Parallelogram shape (FIG. 7) | Parallel1 end 0arrangement (Arrangement in equilateral triangular shape) | 25 | 34 | 168 | |
| Example 5 | 1.0 | 1.0 | 0.25 | 1.8 | Hexagonal shape (FIG. 9) | Parallel end arrangement (Arrangement in equilateral triangular shape) | 15 | 31 | 165 | |
| Comparative Example 1 | 1.0 | 1.0 | 0.25 | 1.8 | Rectangular shape | Parallel end arrangement (Arrangement in isosceles triangular shape) | 0 | 40 | 175 | A side is present in which a joint line between shots has a zigzag shape, and thus crystallinity at this position deteriorates |
| Comparative Example 2 | 2.0 | 1.0 | 0.50 | 1.0 to 2.0 | Parallelogram shape (FIG. 7) | Parallel end arrangement (Arrangement in equilateral triangular shape) | 15 | 36 | 171 | There is a tendency for the diameter of the dot to increase, and crystallinity deteriorates |
| Comparative Example 3 | 2.0 | 1.0 | 0.50 | 1.0 to 2.0 | Parallelogram shape (FIG. 7) | Parallel end arrangement (Arrangement in equilateral triangular shape) | 15 | 35 | 169 | |
| Comparative Example 4 | 2.0 | 1.0 | 0.50 | 2.0 | Parallelogram shape (FIG. 7) | Parallel end arrangement (Arrangement in equilateral triangular shape) | 15 | 36 | 172 | |
| Comparative Example 5 | 1.6 | 1.0 | 0.38 | 1.8 | Parallelogram shape (FIG. 7) | Parallel end arrangement (Arrangement in equilateral triangular shape) | 15 | 35 | 169 | |

The convex portion formed in the substrate of each example, which was obtained in this manner, had a bowl container shape (hemispheric shape) in which a planar shape of a base was a circular shape, the external shape thereof became gradually smaller toward the vertex portion, and a side surface was curved toward the outside. A slight joint line, which was derived from a gap while the reticle was moved on the substrate, was seen on the flat surface of the substrate. In addition, it was confirmed that the plurality of convex portions formed in the substrate were arranged to be parallel with each joint line, and to be periodic in the two axial directions of one arrangement axis and the other arrangement axis intersecting each other in an in-plane direction of the flat surface of the substrate, and the convex portions were uniformly formed.

In addition, a buffer layer, which was formed from AlN having a single crystal structure and had a thickness of 50 nm, was formed on the main surface of the substrate in which the plurality of convex portions were formed using an RF sputtering method (buffer layer-forming process). At this time, a mechanism, which is provided with a high frequency type power supply, and a position of a magnet may be shifted within a target, was used as a sputter film-forming apparatus.

An underlying layer, which had a film thickness of 8 μm and was formed from GaN, was epitaxially grown on the buffer layer using a reduced pressure MOCVD method (epitaxial process).

Next, respective layers including an n-type semiconductor layer, a light-emitting layer, and a p-type semiconductor layer, which make up the LED structure, were laminated on the underlying layer in this order using the reduced pressure MOCVD method, whereby a light-emitting element as shown in FIG. 3 (also, refer to FIG. 4) was prepared. Furthermore, a lamp (light-emitting diode: LED) using the light-emitting element as shown in FIG. 10 was prepared.

The n-type semiconductor layer was formed by a Si-doped n-type contact layer and an n-type clad layer. At this time, as the n-type contact layer, a GaN layer having a carrier concentration of $5 \times 10^{18}$ cm$^{-3}$ and a thickness of 2 μm was formed. In addition, as the n-type clad layer, a superlattice structure, in which twenty pairs of $Ga_{0.99}In_{0.01}N$ and GaN were laminated, was formed. The carrier concentration of the n-type clad layer was set to f $4 \times 10^{18}$ cm$^{-3}$ and the thickness thereof was set to 60 nm.

The light-emitting layer was set to a multiple-quantum-well structure including a barrier layer formed from GaN, and a well layer formed from $Ga_{0.8}In_{0.2}N$. At this time, the barrier layer having a thickness of 6 nm and the well layer having a thickness of 2 nm were laminated in six layers, respectively, and one layer of the barrier layer was laminated on the resultant laminated body.

Furthermore, a p-type semiconductor layer including a Mg-doped p-type clad layer and a p-type contact layer was formed on the light-emitting layer. At this time, as the p-type clad layer, four pairs of non-doped $Al_{0.06}Ga_{0.94}N$ having a thickness of 2.5 nm and Mg-doped GaN having a thickness of 2.5 nm were laminated. In addition, a p-type contact layer, which was formed from GaN and had a thickness of 200 nm, was formed on the p-type clad layer.

Next, a light-emitting diode (LED), which is a kind of semiconductor light-emitting element, was prepared in the following sequence by using the substrate on which the respective layers making up the LED structure that was obtained in the above-described sequence were formed (refer to FIG. 3).

First, a light-transmitting positive electrode formed from ITO was formed on the p-type contact layer of the substrate in which the respective layers having the LED structure were formed by a photolithography technology. Furthermore, a positive-electrode bonding pad having a structure in which Ti, Al, and Au were sequentially laminated was formed on the light-transmitting positive electrode.

Next, the substrate, in which the positive-electrode bonding pad was formed, was subjected to dry etching to expose the n-type semiconductor layer at a portion at which a negative-electrode bonding pad was formed, whereby the negative-electrode bonding pad having a laminated structure of four layers of Ni, Al, Ti, and Au was formed on the exposed n-type semiconductor layer.

In addition, a rear surface of the substrate, in which the positive-electrode bonding pad and the negative-electrode bonding pad were formed, was ground and polished to make the rear surface into a mirror-state surface, and then the substrate was cut into a square chip of 350 μm square, whereby an LED chip (light-emitting element) was obtained.

Then, this chip was placed on a lead frame in such a manner that the positive-electrode bonding pad and the negative-electrode bonding pad became an upper side, and a wire-connection was made to the lead frame with a metallic wire, whereby a lamp (refer to FIG. 10) was prepared.

In addition, when a forward current of 20 mA was made to flow between the p-side and n-side electrodes of the lamp that was prepared as described above, a forward voltage (a driving voltage Vf) was measured and at the same time, a light-emitting output $P_o$ (mW) was measured through the p-side light-transmitting positive electrode. An average value thereof is shown in Table 2. In addition, the external appearance on a light extraction side of each sample, that is, on a light-transmitting positive electrode side was confirmed with the naked eye. Results of the visual observation are shown in Table 2 (in Table 2, a case in which evaluation on the external appearance properties was acceptable is indicated by A, and a non-acceptable case is indicated by B). In addition, in this example, from the evaluation results of the light-emitting properties, a case in which the driving voltage Vf was 3.2 (V) or less and the light-emitting output $P_o$ was 23 (mW) or more was determined as acceptable, and a yield ratio thereof was examined.

TABLE 2

| | Light-emitting properties | | Yield ratio | External appearance properties | |
|---|---|---|---|---|---|
| | Driving voltage Vf (V) | Light-emitting output PO (mW) | (per one sheet of wafer) (%) | (A or B) | Notes with regard to external appearance properties |
| Example 1 | 2.93 | 23.9 | 95.0 | A | |
| Example 2 | 2.87 | 24.9 | 97.0 | A | |
| Example 3 | 2.93 | 24.3 | 94.0 | A | |
| Example 4 | 3.01 | 24.1 | 93.0 | A | |
| Example 5 | 2.86 | 24.9 | 96.0 | A | |
| Comparative Example 1 | 3.00 | 24.0 | 80.0 | B | Significant abnormal growth in a direction orthogonal to orientation flat |
| Comparative Example 2 | 2.97 | 23.0 | 89.0 | B | Significant abnormal growth in a direction orthogonal to orientation flat |
| Comparative Example 3 | 2.99 | 22.9 | 91.0 | B | Significant abnormal growth in a direction orthogonal to orientation flat |
| Comparative Example 4 | 2.95 | 23.5 | 93.0 | B | Significant abnormal growth in a direction orthogonal to orientation flat |
| Comparative Example 5 | 2.93 | 23.7 | 90.0 | B | Significant abnormal growth in a direction orthogonal to orientation flat |

As shown in Table 2, in the lamp using the light-emitting element prepared according to the manufacturing method related to the invention, since the driving voltage Vf was 2.76 to 3.14 V (an average value: 2.93 V), and the light-emitting output $P_o$ was 23.69 to 24.12 mW (an average value: 23.9 mW), it was clear that the light-emitting properties were excellent. In addition, in the lamp of Example 1 in which the light-emitting element obtained in this example was used, it was clear that a defect such as a line in a crystal was hardly recognized with the naked eye in a visual inspection on the light-transmitting positive electrode side, a modified portion was not generated in the semiconductor crystal, the external appearance properties were excellent, and the yield ratio was excellent.

Example 2

In Example 2, a substrate having the main surface including the flat surface and the convex portions having the conditions shown in Table 1 was prepared in the same sequence as Example 1 except that as the reticle, a reticle was used which had a parallelogram shape in a plan view, and in which a cut-out portion was formed at one corner portion among corner portions of the reticle as shown in FIG. 7 and Table 1. Then, the buffer layer and the underlying layer were laminated on the substrate. At this time, the mask patterns were formed on the surface of the substrate while moving the reticle in such a manner that a position of the cut-out portion of the reticle and a position of at least one corner portion among the corner portions of the reticle after the movement overlap each other during sequential movement of the reticle on the substrate according to the stepper exposure method. In addition, a half-value width of X-ray diffraction (XRD) of a (10-10) plane and a (0002) plane of the underlying layer was measured by the same method as Example 1. Results are shown in Table 1.

Furthermore, the respective layers making up the LED structure were formed on the underlying layer in the same sequence as Example 1, and the light-transmitting positive electrode, the positive-electrode bonding pad, and the negative-electrode bonding pad were provided, whereby the LED chip was prepared. In addition, this chip was placed on the lead frame in the same sequence as Example 1, whereby the lamp was prepared.

In addition, the forward voltage (driving voltage Vf), and the light-emitting output $P_o$ (mW) were measured in the same manner as Example 1. Results thereof are shown in Table 2. In addition, the external appearance on the light-transmitting positive electrode side was confirmed with the naked eye. Results thereof are shown in Table 2. Furthermore, the yield ratio was examined from the evaluation results of the light-emitting properties as described above. Results thereof are shown in Table 2.

As shown in Table 2, in the lamp of Example 2 using the light-emitting element prepared according to conditions defined in the invention by using the reticle in which the cut-out portion was formed at one corner portion among corner portions, since the driving voltage Vf was 2.71 to 3.06 V (an average value: 2.87 V), and the light-emitting output $P_o$ was 24.67 to 25.12 mW (an average value: 24.9 mW), it was clear that the light-emitting properties were excellent. In addition, in the lamp in which the light-emitting element obtained in this example was used, it was clear that a defect such as a line in a crystal was hardly recognized with the naked eye in a visual inspection on the light-transmitting positive electrode side, a modified portion was not generated in the semiconductor crystal, the external appearance properties were excellent, and at the same time, the yield ratio was excellent.

Examples 3 and 4

In Examples 3 and 4, a substrate having the main surface including the flat surface and the convex portions having the conditions shown in Table 1 was prepared in the same sequence as Example 2 except that one side of the reticle having a parallelogram shape in a plan view as shown in FIG. 7 was inclined with respect to the orientation flat of the substrate at an angle shown in Table 1. Then, the buffer layer and the underlying layer were laminated on the substrate. At this time, the mask patterns were formed on the surface of the substrate while moving the reticle in such a manner that a position of the cut-out portion of the reticle and a position of at least one corner portion among the corner portions of the reticle after the movement overlap each other during sequential movement of the reticle on the substrate according to the stepper exposure method. In addition, the half-value width of X-ray diffraction (XRD) of the (10-10) plane and the (0002) plane of the underlying layer was measured by the same method as Example 2. Results are shown in Table 1.

Furthermore, the respective layers making up the LED structure were formed on the underlying layer in the same sequence as Example 2, and the light-transmitting positive electrode, the positive-electrode bonding pad, and the negative-electrode bonding pad were provided, whereby the LED chip was prepared. In addition, this chip was placed on the lead frame in the same sequence as Example 2, whereby the lamp was prepared.

In addition, the forward voltage (driving voltage Vf), and the light-emitting output $P_o$ (mW) were measured in the same manner as Example 2. Results thereof are shown in Table 2. In addition, the external appearance on the light-transmitting positive electrode side was confirmed with the naked eye. Results thereof are shown in Table 2. Furthermore, the yield ratio was examined from the evaluation results of the light-emitting properties as described above. Results thereof are shown in Table 2.

As shown in Table 2, in the lamps of Examples 3 and 4 using the light-emitting element prepared according to conditions defined in the invention by using the reticle in which the cut-out portion was formed at one corner portion among corner portions, since the driving voltage Vf was 2.90 to 3.20 V (an average value: 2.93 to 3.01 V), and the light-emitting output $P_o$ was 23.8 to 24.5 (an average value: 24.1 to 24.3 mW), it was clear that the light-emitting properties were excellent. In addition, in the lamp in which the light-emitting element obtained in this example was used, it was clear that a defect such as a line in a crystal was hardly recognized with the naked eye in a visual inspection on the light-transmitting positive electrode side, a modified portion was not generated in the semiconductor crystal, the external appearance properties were excellent, and at the same time, the yield ratio was excellent.

Example 5

In Example 5, a substrate having the main surface including the flat surface and the convex portions having the conditions shown in Table 1 was prepared in the same sequence as Example 2 except a reticle that had a hexagonal shape in a plan view and had a cut-out portion as shown in FIG. 9B was used, and one side of the reticle was inclined with respect to the orientation flat of the substrate at an angle shown in Table 1. Then, the buffer layer and the underlying layer were laminated on the substrate. At this time, as described above, the mask patterns were formed on the surface of the substrate while moving the reticle having the hexagonal shape in such a manner that a position of the cut-out portion of the reticle and a position of at least one corner portion among the corner portions of the reticle after the movement overlap each other during sequential movement of the reticle on the substrate according to the stepper exposure method. In addition, the half-value width of X-ray diffraction (XRD) of the (10-10) plane and the (0002) plane of the underlying layer was measured by the same method as Example 2. Results are shown in Table 1.

Furthermore, the respective layers making up the LED structure were formed on the underlying layer in the same sequence as Example 2, and the light-transmitting positive electrode, the positive-electrode bonding pad, and the negative-electrode bonding pad were provided, whereby the LED chip was prepared. In addition, this chip was placed on the lead frame in the same sequence as Example 3, whereby the lamp was prepared.

In addition, the forward voltage (driving voltage Vf), and the light-emitting output $P_o$ (mW) were measured in the same manner as Example 2. Results thereof are shown in Table 2. In addition, the external appearance on the light-transmitting positive electrode side was confirmed with the naked eye. Results thereof are shown in Table 2. Furthermore, the yield ratio was examined from the evaluation results of the light-emitting properties as described above. Results thereof are shown in Table 2.

As shown in Table 2, in the lamp of Example 5 using the light-emitting element prepared according to conditions defined in the invention by using the reticle having the hexagonal shape in which the cut-out portion was formed at one corner portion among corner portions, since the driving voltage Vf was 2.68 to 3.25 V (an average value: 2.86 V), and the light-emitting output $P_o$ was 24.69 to 25.13 mW (an average value: 24.9 mW), it was clear that the light-emitting properties were excellent. In addition, in the lamp in which the light-emitting element obtained in this example was used, it was clear that a defect such as a line in a crystal was hardly recognized with the naked eye in a visual inspection on the light-transmitting positive electrode side, a modified portion was not generated in the semiconductor crystal, the external appearance properties were excellent, and at the same time, the yield ratio was excellent.

Comparative Example 1

In Comparative Example 1, a substrate having the main surface including the flat surface and the convex portions having the conditions shown in Table 1 was prepared in the same sequence as Example 1 except that as the reticle configured to form the mask patterns on the flat surface of the substrate according to the stepper exposure method in the substrate-processing process, a reticle which had a rectangular shape in a plan view and has been used in the related art was used. Then, the buffer layer and the underlying layer were laminated on the substrate. In addition, the half-value width of X-ray diffraction (XRD) of the (10-10) plane and the (0002) plane of the underlying layer was measured by the same method as Example 1. Results thereof are shown in Table 1.

Furthermore, the respective layers making up the LED structure were formed on the underlying layer in the same sequence as Example 1, and the light-transmitting positive electrode, the positive-electrode bonding pad, and the negative-electrode bonding pad were provided, whereby the LED chip was prepared. In addition, this chip was placed on the lead frame in the same sequence as Example 1, whereby the lamp was prepared.

In addition, the forward voltage (driving voltage Vf), and the light-emitting output $P_o$ (mW) were measured in the same manner as Example 1. Results thereof are shown in Table 2. In addition, the external appearance on the light-transmitting positive electrode side was confirmed with the naked eye. Results thereof are shown in Table 2.

As shown in Table 2, in Comparative Example 1, the driving voltage Vf was 2.80 to 3.25 V (an average value: 3.00 V), the light-emitting output $P_o$ was within a range of 22.67 to 24.21 mW (an average value: 24.0 mW), and a distribution of the light-emitting output $P_o$ was slightly large. In addition, in Comparative Example 1 in which the substrate having the main surface including the flat surface and the convex portions according to the method in the related art was prepared, the yield ration was very low at 80.0%. Furthermore, in Comparative Example 1, significant abnormal growth in the crystal was confirmed in a direction orthogonal to the orientation flat, and evaluation on the external appearance properties was "B". This was considered to be because under the conditions of Comparative Example 1, a side was present (one side of the reticle) in which a joint line between shots became non-linear, and thus a crystal of the convex portion that was derived from the mask pattern formed in the vicinity of the one side was inferior.

Comparative Examples 2 to 5

In Comparative Examples 2 to 5, a substrate having the main surface including the flat surface and the convex portions having the conditions shown in Table 1 was prepared in the above-described sequence by using the reticle described in Example 2 as the reticle configured to form the mask patterns on the flat surface of the substrate according to the stepper exposure method in the substrate-processing process. Then, the buffer layer and the underlying layer were laminated on the substrate. In addition, the half-value width of X-ray diffraction (XRD) of the (10-10) plane and the (0002) plane of the underlying layer was measured by the same method as Example 2. Results thereof are shown in Table 1.

Furthermore, the respective layers making up the LED structure were formed on the underlying layer in the same sequence as Example 2, and the light-transmitting positive electrode, the positive-electrode bonding pad, and the negative-electrode bonding pad were provided, whereby the LED chip was prepared. In addition, this chip was placed on the lead frame in the same sequence as Example 2, whereby the lamp was prepared.

In addition, the forward voltage (driving voltage Vf), and the light-emitting output $P_o$ (mW) were measured in the same manner as Example 2. Results thereof are shown in Table 2. In addition, the external appearance on the light-transmitting positive electrode side was confirmed with the naked eye. Results thereof are shown in Table 2. Furthermore, the yield ratio was examined from the evaluation results of the light-emitting properties as described above. Results thereof are shown in Table 2.

As shown in Table 2, in Comparative Examples 2 to 5, the driving voltage Vf was within a range of 2.73 to 3.25 V (an average value: 2.93 to 2.99 V), the light-emitting output $P_o$ was within a range of 22.75 to 24.0 mW (an average value: 22.9 to 23.7 mW), there was no particular problem with regard to the light-emitting properties, and the yield ratio was within a range of 89.0 to 93.0%. However, in all of Comparative Examples 2 to 5, the evaluation on the external appearance properties was "B", and the base width of the convex portion had a slightly large size at 2.0 µm, and thus there was a problem in which the crystallinity was slightly inferior.

From the results of the above-described examples, it is clear that in the Group III nitride semiconductor light-emitting element that may be obtained by using the manufacturing method and the reticle of the invention, the internal quantum efficiency and the light extraction efficiency are high, and the light-emitting properties and the external appearance properties are excellent.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a Group III nitride semiconductor light-emitting element in which a single crystalline Group III nitride semiconductor layer is formed on a substrate formed from sapphire, and an LED structure is formed on the Group III nitride semiconductor layer, the method comprising:
   a substrate-processing process of periodically forming a plurality of convex portions having a base width $d_1$ and a height h in a flat surface, which is formed from a (0001) C-plane, of the substrate to form a main surface including the flat surface and the convex portions in the substrate;
   an epitaxial process of epitaxially growing the Group III nitride semiconductor on the main surface of the substrate so as to cover the flat surface and the convex portions; and
   an LED lamination process of forming the LED structure by epitaxially growing the Group III nitride semiconductor subsequently to the epitaxial process,
   wherein the substrate-processing process includes,
   a patterning process of sequentially forming mask patterns in respective regions of the flat surface using a polygonal reticle having two pairs of parallel opposing ends in a plan view by a stepper exposure method, and
   an etching process of forming the plurality of convex portions by etching the flat surface using the mask patterns, and
   wherein, in an in-plane direction of the flat surface of the substrate, the plurality of the convex portions are arranged to be parallel with the two pairs of parallel ends of the reticle, respectively, and to be periodic in two axial directions of one arrangement axis and the other arrangement axis intersecting each other, and,
   among the plurality of convex portions, three arbitrary convex portions, which are adjacent to each other and are arranged in a triangular shape in a plan view, are disposed and formed in an isosceles triangular shape in a plan view.

2. The method for manufacturing a Group III nitride semiconductor light-emitting element according to claim 1,
   wherein when disposing and forming the three arbitrary convex portions in the isosceles triangular shape in a plan view, a vertex angle of the isosceles triangular shape is within a range of 45° to 75°.

3. The method for manufacturing a Group III nitride semiconductor light-emitting element according to claim 1,
   wherein in the substrate-processing process, the mask patterns are sequentially formed in the respective regions of the flat surface of the substrate using the reticle having a parallelogram shape in a plan view, and the flat surface is etched to form the plurality of convex portions.

4. The method for manufacturing a Group III nitride semiconductor light-emitting element according to claim 1,
   wherein in the substrate-processing process, the mask patterns are sequentially formed in the respective regions of the flat surface of the substrate using the reticle having a hexagonal shape in a plan view, and the flat surface is etched to form the plurality of convex portions.

5. The method for manufacturing a Group III nitride semiconductor light-emitting element according to claim 1,
   wherein the mask patterns are formed on the flat surface of the substrate while sequentially moving the reticle in a state in which one side of the reticle is inclined with respect to a cleavage direction of the substrate at an angle of 5° to 25° in a planar direction of the substrate.

6. The method for manufacturing a Group III nitride semiconductor light-emitting element according to claim 5,
   wherein in the substrate-processing process, as the reticle, a reticle in which a cut-out portion is formed on at least one arbitrary corner portion among corner portions of the reticle is used, and the mask patterns are formed on the surface of the substrate while moving the reticle in such a manner that a position of the cut-out portion of the reticle and a position of at least one corner portion among the corner portions of the reticle after the movement overlap each other during sequential movement of the reticle on the substrate according to a stepper exposure method.

7. The method for manufacturing a Group III nitride semiconductor light-emitting element according to claim 1,
   wherein in the substrate-processing process, the convex portions are formed to have the base width $d_1$ within a range of 0.05 to 1.5 μm, and the height h within a range of 0.05 to 1 μm.

8. The method for manufacturing a Group III nitride semiconductor light-emitting element according to claim 1,
   wherein in the substrate-processing process, the convex portions are formed in such a manner that the height h becomes ¼ or more times the base width $d_1$, and a distance d2 between the convex portions adjacent to each other becomes 0.5 to 5 times the base width $d_1$.

9. The method for manufacturing a Group III nitride semiconductor light-emitting element according to claim 1,
   wherein in the substrate-processing process, the convex portions are formed to have a shape in which an external shape thereof becomes gradually smaller toward the vertex portion.

10. The method for manufacturing a Group III nitride semiconductor light-emitting element according to claim 1,
    wherein in the substrate-processing process, the convex portions are formed in a conical shape or a polygonal pyramid shape.

11. The method for manufacturing a Group III nitride semiconductor light-emitting element according to claim 1, further comprising:
    a buffer layer-forming process of laminating a buffer layer, which is formed from a single crystalline or polycrystalline $Al_xGa_{1-x}N$ ($0 \leq x \leq 1$) and has a thickness of 0.01 to 0.5 μm, on the main surface of the substrate according to a sputtering method after the substrate-processing process and before the epitaxial process.

12. The method for manufacturing a Group III nitride semiconductor light-emitting element according to claim 1,
    wherein in the LED lamination process, the LED structure is formed by laminating an n-type semiconductor layer, a light-emitting layer, and a p-type semiconductor layer that are formed from a Group III nitride semiconductor, respectively, in this order on the Group III nitride semiconductor layer that is formed on the main surface of the substrate.

13. A Group III nitride semiconductor light-emitting element that is obtained according to the manufacturing method according to claim 1.

14. A lamp in which the Group III nitride semiconductor light-emitting element according to claim 13 is used.

* * * * *